US011085273B2

(12) United States Patent
Williams et al.

(10) Patent No.: US 11,085,273 B2
(45) Date of Patent: Aug. 10, 2021

(54) DETERMINING SOURCES OF ERRONEOUS DOWNHOLE PREDICTIONS

(71) Applicant: Halliburton Energy Services, Inc., Houston, TX (US)

(72) Inventors: Robert Lynn Williams, Spring, TX (US); Aidan James Porter, Lancashire (GB); Vitor Lopes Pereira, The Woodlands, TX (US); Joshua Samuel Gollapalli, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 659 days.

(21) Appl. No.: 15/747,017

(22) PCT Filed: Aug. 27, 2015

(86) PCT No.: PCT/US2015/047289
§ 371 (c)(1),
(2) Date: Jan. 23, 2018

(87) PCT Pub. No.: WO2017/034588
PCT Pub. Date: Mar. 2, 2017

(65) Prior Publication Data
US 2018/0216443 A1 Aug. 2, 2018

(51) Int. Cl.
*E21B 41/00* (2006.01)
*G05B 13/04* (2006.01)
(Continued)

(52) U.S. Cl.
CPC .......... *E21B 41/0092* (2013.01); *E21B 44/00* (2013.01); *E21B 47/00* (2013.01); *E21B 47/12* (2013.01); *G05B 13/048* (2013.01)

(58) Field of Classification Search
CPC ...... E21B 41/0092; E21B 44/00; E21B 47/00; E21B 47/12; G05B 13/048
(Continued)

(56) References Cited

U.S. PATENT DOCUMENTS 6,443,242 B1 * 9/2002 Newman ................. E21B 44/00
166/381
6,665,117 B2 12/2003 Neff et al.
(Continued)

FOREIGN PATENT DOCUMENTS

CA 2634470 A1 * 7/2004 ......... G06K 9/00536
CA 2634328 8/2011
(Continued)

OTHER PUBLICATIONS

Golden, Constance J. "Fault Diagnostics Using Expert Systems", AIAA 92-0871, 1992, 6 pages. (Year: 1992).*
(Continued)

*Primary Examiner* — Iftekhar A Khan
(74) *Attorney, Agent, or Firm* — Kilpatrick Townsend & Stockton LLP

(57) ABSTRACT

A system usable in a wellbore can include a processing device and a memory device in which instructions executable by the processing device are stored for causing the processing device to: generate multiple predicted values of a first parameter associated with a well environment or a wellbore operation; determine a first trend indicated by the multiple predicted values; receive, from a sensor, multiple measured values of a second parameter associated with the well environment or the wellbore operation; determine a second trend indicated by the multiple measured values; determine a difference between the first trend and the second trend or a rate of change of the difference; and in response to the difference exceeding a threshold or the rate of change
(Continued)

exceeding another threshold, determine a source of the difference including at least one of an erroneous user input, an equipment failure, a wellbore event, or a model error.

20 Claims, 12 Drawing Sheets

(51) Int. Cl.
    *E21B 44/00*     (2006.01)
    *E21B 47/00*     (2012.01)
    *E21B 47/12*     (2012.01)

(58) Field of Classification Search
    USPC .......................................................... 703/10
    See application file for complete search history.

(56) References Cited

U.S. PATENT DOCUMENTS

| | | | |
|---|---|---|---|
| 7,316,278 B2* | 1/2008 | Hutchinson | E21B 44/00 175/39 |
| 7,346,456 B2* | 3/2008 | Le Bemadjiel | E21B 43/04 702/9 |
| 7,357,196 B2* | 4/2008 | Goldman | E21B 49/003 175/24 |
| 7,725,302 B2 | 5/2010 | Ayan et al. | |
| 7,896,105 B2 | 3/2011 | Dupriest et al. | |
| 7,953,587 B2 | 5/2011 | Bratton et al. | |
| 8,527,249 B2 | 9/2013 | Jamison et al. | |
| 8,818,779 B2 | 8/2014 | Sadlier et al. | |
| 8,996,346 B2 | 3/2015 | Zuo et al. | |
| 9,175,557 B2* | 11/2015 | Iversen | E21B 44/00 |
| 9,187,088 B1* | 11/2015 | Ferguson | B60W 30/09 |
| 9,784,089 B2* | 10/2017 | Boone | E21B 7/04 |
| 10,113,910 B2 | 10/2018 | Brunk et al. | |
| 2002/0059048 A1* | 5/2002 | Hardy | E21B 47/007 703/10 |
| 2005/0216197 A1 | 9/2005 | Zamora et al. | |
| 2005/0279532 A1 | 12/2005 | Ballantyne et al. | |
| 2007/0179767 A1 | 8/2007 | Cullick et al. | |
| 2011/0125476 A1* | 5/2011 | Craig | G01V 1/288 703/10 |
| 2011/0153296 A1 | 6/2011 | Sadlier et al. | |
| 2013/0124171 A1* | 5/2013 | Schuette | G06F 30/20 703/2 |
| 2013/0222390 A1* | 8/2013 | Ross | E21B 47/09 345/440 |
| 2014/0076632 A1* | 3/2014 | Wessling | E21B 47/06 175/48 |
| 2014/0083681 A1* | 3/2014 | Taylor | G01V 1/42 166/250.1 |
| 2014/0326449 A1* | 11/2014 | Samuel | E21B 41/0092 166/250.01 |
| 2014/0351183 A1* | 11/2014 | Germain | E21B 44/00 706/12 |
| 2015/0081221 A1* | 3/2015 | Mancini | E21B 44/00 702/9 |
| 2015/0081265 A1* | 3/2015 | Kauerauf | G01V 1/40 703/10 |
| 2015/0130627 A1* | 5/2015 | Morrison | E21B 44/00 340/854.4 |
| 2015/0226049 A1* | 8/2015 | Frangos | E21B 49/00 702/6 |
| 2016/0003019 A1* | 1/2016 | Safariforoshani | E21B 43/26 703/10 |
| 2016/0273346 A1* | 9/2016 | Tang | E21B 47/06 |
| 2016/0369621 A1* | 12/2016 | Salminen | E21B 44/00 |
| 2018/0202280 A1* | 7/2018 | Williams | E21B 47/00 |
| 2018/0202285 A1* | 7/2018 | Williams | E21B 21/08 |
| 2018/0216443 A1* | 8/2018 | Williams | E21B 47/00 |

FOREIGN PATENT DOCUMENTS

| | | |
|---|---|---|
| CA | 2634470 | 5/2013 |
| WO | 2013119480 | 8/2013 |
| WO | 2015060865 | 4/2015 |
| WO | 2017034586 | 3/2017 |
| WO | 2017034587 | 3/2017 |

OTHER PUBLICATIONS

David et al. "Achieving Drilling Excellence through Next Generation Workflows Enabled by Integrating Historical Drilling Data and Real Time Data", SPE-172151-MS, 2014, 11 pages. (Year: 2014).*
Nybo et al. "The Overlooked Drilling Hazard: Decision Making From Bad Data", SPE 150306, 2012, 8 pages. (Year: 2012).*
Holst et al., "Deviation Detection of Industrial Processes", ERCIM News No. 56, Jan. 2004, 2 pages.
International Patent Application No. PCT/US2015/047278, "International Search Report and Written Opinion", May 19, 2016, 13 pages.
International Patent Application No. PCT/US2015/047287, "International Search Report and Written Opinion", May 19, 2016, 14 pages.
International Patent Application No. PCT/US2015/047289, "International Search Report and Written Opinion", May 19, 2016, 13 pages.
Vachkov et al., "Detection of Deviation in Performance of Battery Cells by Data Compression and Similarity Analysis", International Journal of Intelligent Systems, vol. 29, 2014, pp. 207-222.
CA2,991,573, "Office Action", dated Oct. 16, 2019, 5 pages.
CA2,992,704, "Office Action", dated Dec. 12, 2019, 5 pages.
CA2,992,710, "Office Action", dated Dec. 12, 2019, 4 pages.
U.S. Appl. No. 15/744,387, Non-Final Office Action, dated May 14, 2020, 11 pages.
U.S. Appl. No. 15/744,620, Non-Final Office Action, dated Feb. 24, 2020, 7 pages.
U.S. Appl. No. 15/744,620, Notice of Allowance, dated Jun. 18, 2020, 8 pages.
U.S. Appl. No. 15/744,387, Non-Final Office Action, dated Nov. 29, 2019, 10 pages.

* cited by examiner

DETERMINING SOURCES OF ERRONEOUS DOWNHOLE PREDICTIONS

CROSS-REFERENCE TO RELATED APPLICATIONS

This application is related to International Patent Application No. PCT/US2015/047278 titled "Predicting Wellbore Operation Parameters", and International Patent Application No. PCT/US2015/047287 titled "Tuning Predictions of Wellbore Operation Parameters" both of which were filed on Aug. 27, 2015. The entirety of both applications are hereby incorporated herein by reference.

TECHNICAL FIELD

The present disclosure relates generally to devices for use with well systems. More specifically, but not by way of limitation, this disclosure relates to a system for determining sources of erroneous downhole predictions.

BACKGROUND

A well system (e.g., oil or gas wells for extracting fluid or gas from a subterranean formation) can include a wellbore. Various well tools can be used for performing operations in the wellbore. It can be desirable to predict a characteristic or effect of a wellbore operation prior to performing the wellbore operation. For example, it can be desirable to predict an amount of pressure generated by a drilling operation. It can be challenging to accurately predict the characteristics of the wellbore operation.

DETAILED DESCRIPTION

Figure 1:
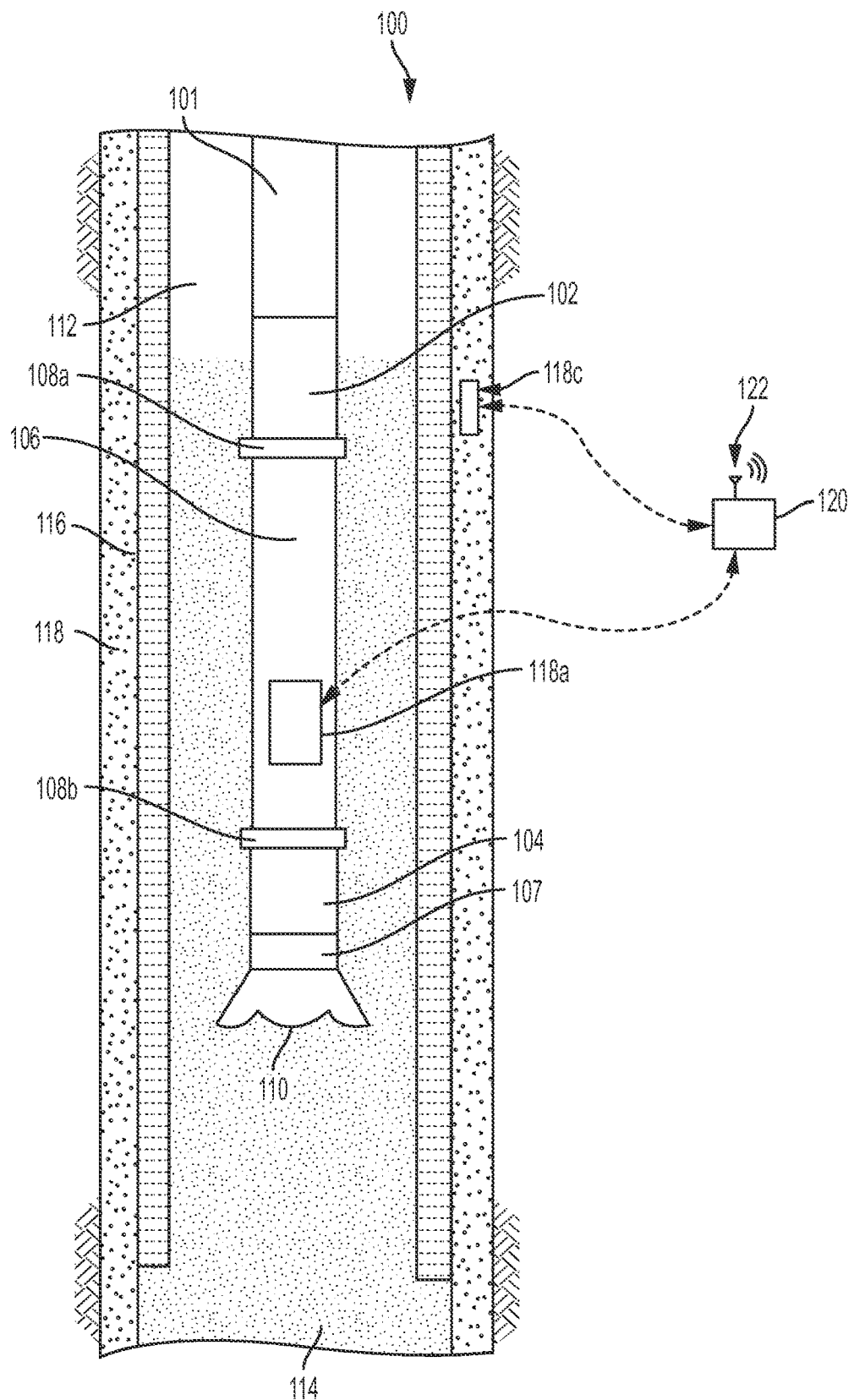
FIG. 1 is a cross-sectional view of an example of a part of a well system that includes a system for determining sources of erroneous downhole predictions according to some aspects.

Certain aspects and features of the present disclosure relate to a system for determining a source of an erroneous predicted value of a parameter associated with an environmental condition in a wellbore or associated with a wellbore operation. For example, the system can compare the predicted value of the parameter to a measured value of the parameter (e.g., from a sensor) to determine a difference. If the difference exceeds a threshold, the system can identify a source of the disparity between the predicted value of the parameter and the measured value of the parameter. As another example, the system can determine a first trend indicated by multiple predicted values of the parameter and a second trend indicated by multiple measured values of the parameter. If the first trend and the second trend diverge (or converge), the system can identify a source of the divergence (or convergence).

In some examples, the system can determine if the source (e.g., of a disparity between one or more predicted values of the parameter and one or more measured values of the parameter, or a particular trend) includes an event occurring in the wellbore. The event can include a change in the environmental condition in the wellbore, a well tool operating in a specific manner, the well tool failing to operate in a particular manner, or any combination of these. In some examples, the system can include a sensor proximate to the wellbore for measuring one or more characteristics of the wellbore indicative of a wellbore event. The system can use data from the sensor to determine if the event is occurring or has occurred.

The system can additionally or alternatively determine if the source includes erroneous data input by a user or provided by a sensor. The incorrect data can be used by a model executing on a computing device to generate the predicted value of the parameter. In some examples, the system can compare the data input into the model with measured data from one or more sensors to determine if there is a difference between the two. For example, the system can compare a predicted downhole pressure level input into the model to pressure data from a pressure sensor in the wellbore to determine if there is a difference between the two. In some examples, if there is a difference, the system can determine that incorrect data was input into the model.

The system can additionally or alternatively determine if the source includes an error in the model or an equipment failure. In some examples, the system can output an error notification if the system cannot identify the source. For example, the system can output the error notification if the system determines that the source is not due to an event occurring in the wellbore, incorrect data provided by a user, incorrect data provided by a sensor, an error in the model, an equipment failure, or any combination of these.

In some examples, the system can select and implement one or more processes or tasks based on the source. The one or more processes or tasks can reduce the disparity between a predicted value of the parameter and a measured value of the parameter, alter a trend indicated by multiple predicted values of the parameter and/or multiple measured values of the parameter, or both. For example, if the difference between a predicted value of the parameter and a measured value of the parameter is due to incorrect data input by the user, the system can prompt the user for new data. The system can receive the new data from the user and apply the new data to the model. As another example, if the difference between the predicted value of the parameter and the measured value of the parameter is due to an event occurring in the wellbore, the system can modify a parameter of the model to account for the event, execute a new model, prompt the user for action, or any combination of these. As still another example, if the difference between the predicted value of the parameter and the measured value of the parameter is due to an error in the model, the system can modify a parameter of the model, execute a new model, alert the user to the error in the model, or any combination of these.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional view of an example of a well system 100 that includes a system for determining sources of erroneous downhole predictions according to some aspects. In this example, the well system 100 includes a wellbore extending through various earth strata. The wellbore can extend through a hydrocarbon bearing subterranean formation. In some examples, the wellbore can include a casing string 116 and a cement sheath 124. In some examples, the cement sheath 124 can couple the casing string 116 to a wall of the wellbore. In some examples, the wellbore can include fluid 114. An example of the fluid 114 can include mud. The fluid 114 can flow in an annulus 112 positioned between a well tool 101 and a wall of the casing string 116.

The well tool 101 can be positioned in the wellbore. In some examples, the well tool 101 is a drilling tool, such as a measuring-while-drilling tool. Examples of the drilling tool can include a logging-while-drilling tool, a pressure-while-drilling tool, a temperature-while-drilling tool, or any combination of these. The well tool 101 can include various subsystems 102, 104, 106, 107. For example, the well tool 101 can include a subsystem 102 that includes a communication subsystem. The well tool 101 can also include a subsystem 104 that includes a saver subsystem or a rotary steerable system. A tubular section or an intermediate subsystem 106 (e.g., a mud motor or measuring-while-drilling module) can be positioned between the other subsystems 102, 104. The well tool 101 can include a drill bit 110 for drilling the wellbore. The drill bit 110 can be coupled to another tubular section or intermediate subsystem 107 (e.g., a measuring-while-drilling module or a rotary steerable system). In some examples, the well tool 101 can include tubular joints 108a-b. Tubular joints 108a-b can allow the well tool 101 to bend or can couple various well tool subsystems 102, 104, 106 together.

The well system 100 includes one or more sensors 118a, 118c. The sensors 118a, 118c can detect one or more parameters associated with an environment in the wellbore, a wellbore operation (e.g., the operation of the well tool 101 in the wellbore), or both and transmit, via a wired or wireless interface, associated sensor data to a computing device 120. The sensors 118a-b can be positioned in or on the well tool 101, the casing string 116, the cement sheath 124, or elsewhere in the well system. The sensors 118a, 118c can be of the same type or can be different. Examples of the sensors 118a, 118c can include a pressure sensor, a temperature sensor, a microphone, an accelerometer, a depth sensor, a resistivity sensor, a vibration sensor, a fluid analyzer or detector, an ultrasonic transducer, or any combination of these.

The computing device 120 can be positioned at the well surface, below ground, or offsite. The computing device 120 can include a processor interfaced with other hardware via a bus. A memory, which can include any suitable tangible (and non-transitory) computer-readable medium, such as RAM, ROM, EEPROM, or the like, can embody program components that configure operation of the computing device 120. In some examples, the computing device 120 can include input/output interface components (e.g., a display, keyboard, touch-sensitive surface, and mouse) and additional storage.

The computing device 120 can communicate with the sensors 118a, 118c via a communication device 122. The communication device 122 can represent one or more of any components that facilitate a network connection. In the example shown in FIG. 1, the communication device 122 is wireless and can include wireless interfaces such as IEEE 802.11, Bluetooth, or radio interfaces for accessing cellular telephone networks (e.g., transceiver/antenna for accessing a CDMA, GSM, UMTS, or other mobile communications network). In other examples, the communication device 122 can be wired and can include interfaces such as Ethernet, USB, IEEE 1394, or a fiber optic interface. An example of the computing device 120 is described in greater detail with respect to FIG. 3.

In some examples, the computing device 120 can predict a value of a parameter associated with the environment in the wellbore or a wellbore operation (e.g., operating the well tool 101 in the wellbore). The wellbore operation can include running a tubular (e.g. pipe) into the wellbore, removing the tubular from the wellbore, circulating a fluid 114 through the wellbore, cleaning the wellbore, making a connection between two well system components (e.g., two well tools or tubulars), a drilling operation (e.g., slide drilling or rotary drilling), idling, and/or any other operation occurring in the wellbore. The sensors 118a, 118c can measure the parameter and transmit associated sensor data to the computing device 120. The computing device 120 can receive the sensor data and compare the predicted parameter to the measured parameter to determine a difference between the two. The computing device 120 can plot a data point representative of the difference between the two on a graph, such as a probability-mass distribution graph. The computing device 120 can iterate this process (e.g., in real time) to plot multiple data points on the graph. In some examples, the computing device 120 can analyze the graph or the associated data points to determine the accuracy of one or more predicted values of parameters.

In some examples, the computing device 120 can determine a source of a difference between the predicted parameter and the measured parameter. For example, the computing device 120 can determine that the difference is likely due to an event occurring in the wellbore, an error with a model that generated the predicted value of the parameter, an error with data input by a user, an equipment failure, or any combination of these. The computing device 120, the well operator, or both can perform one or more processes or tasks based on the source of the difference. The processes or tasks can be selected to correct the error or otherwise reduce the difference between the predicted parameter and the measured parameter.

Figure 2:
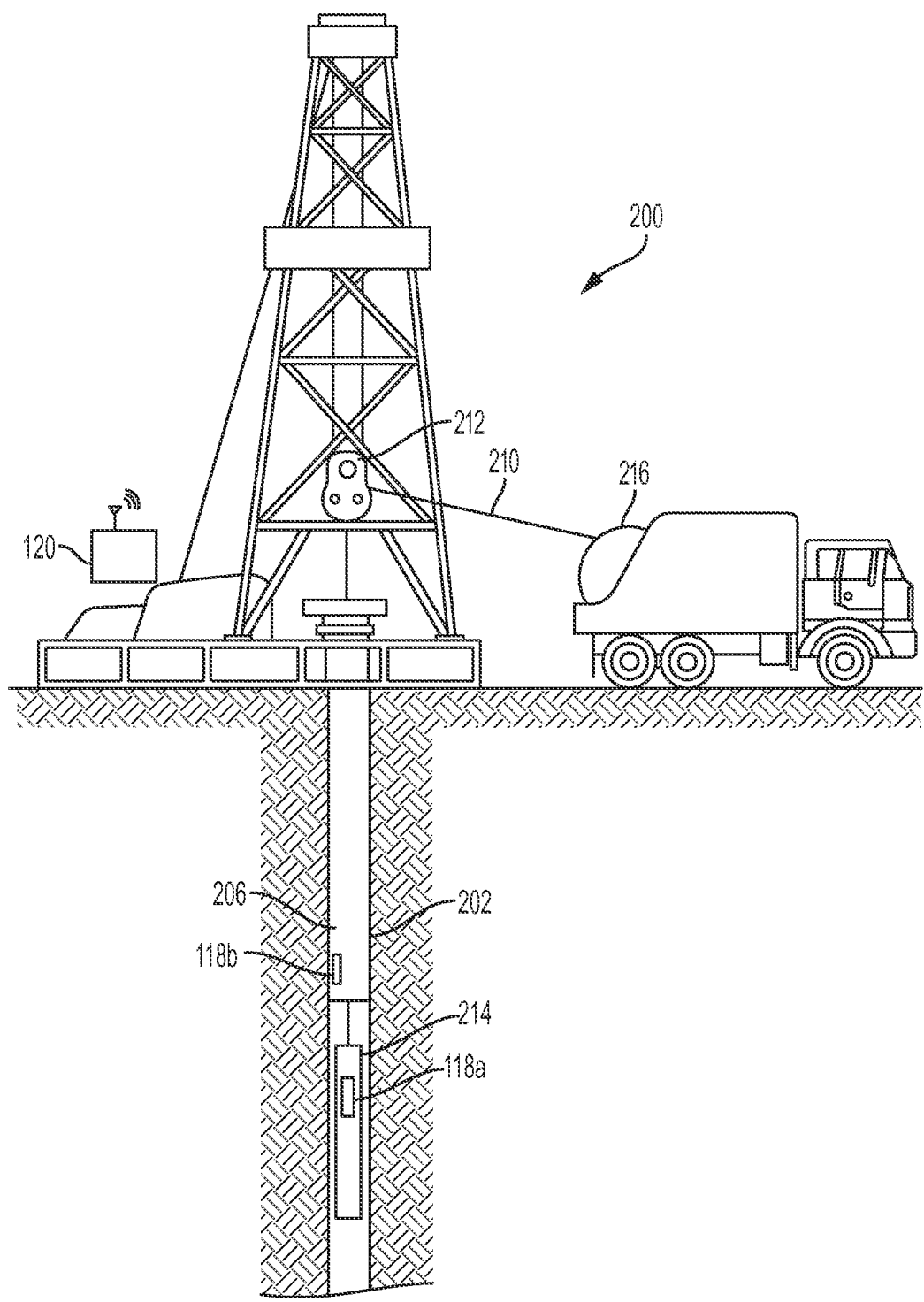
FIG. 2 is a cross-sectional view of an example of a well system that includes a system for determining sources of erroneous downhole predictions according to some aspects.

In some examples, the one or more sensors 118*a*, 118*c* can be positioned in other configurations. For example, referring to FIG. 2, a well system 200 can include one or more sensors 118*a-b*. The sensors 118*a-b* can be coupled to a well tool 214 (e.g., a formation-testing tool) and/or a casing string 206. The well tool 214 can be conveyed into a wellbore 202 via a wireline 210, slickline, or coiled tube. The wireline 210, slickline, or coiled tube can be wound around a reel 216 and guided into the wellbore 202 using, for example, a guide 212 or winch.

The sensors 118*a-b* can transmit data via a wired or wireless interface to the computing device 120. The computing device 120 can compare sensor data from the sensors 118*a-b* with predicted parameters (of an environment in the wellbore or the operation of the well tool 214) to determine differences between the two. The computing device 120 can output the differences via a visual user interface, such as on a graph. In some examples, the computing device 120 can determine a source of a difference between the sensor data and a predicted parameter. The computing device 120, the well operator, or both can perform one or more processes or tasks (based on the source of the difference) selected to reduce the difference between the sensor data and the predicted parameter.

Figure 3:
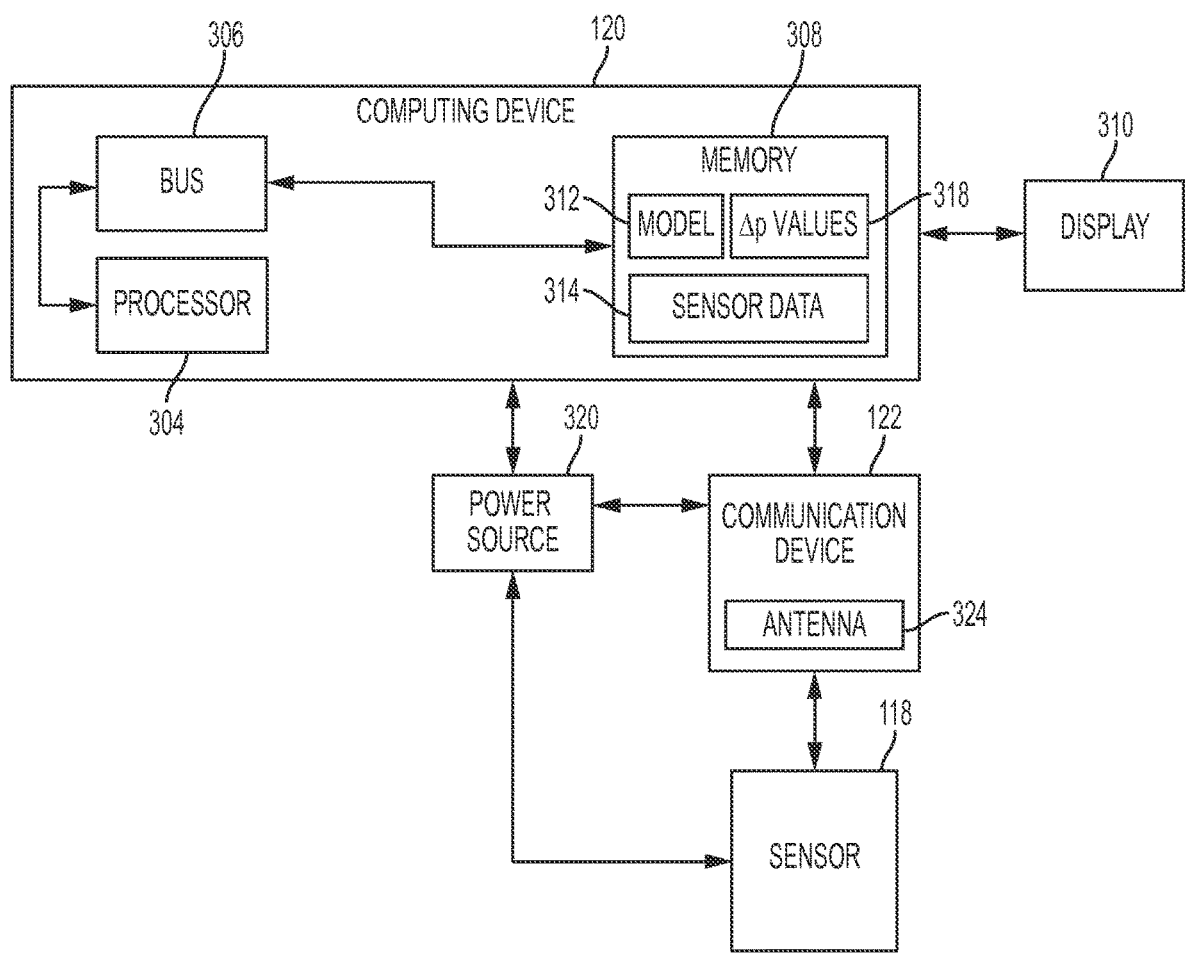
FIG. 3 is a block diagram of an example of a system for determining sources of erroneous downhole predictions according to some aspects.

FIG. 3 is a block diagram of an example of a system for determining sources of erroneous downhole predictions according to some aspects. In some examples, the components shown in FIG. 3 (e.g., the computing device 120, power source 320, display 310, and communication device 122) can be integrated into a single structure. For example, the components can be within a single housing. In other examples, the components shown in FIG. 3 can be distributed (e.g., in separate housings) and in electrical communication with each other.

The computing device 120 can include a processor 304, a memory 308, and a bus 306. The processor 304 can execute one or more operations for determining sources of erroneous downhole predictions. The processor 304 can execute instructions stored in the memory 308 to perform the operations. The processor 304 can include one processing device or multiple processing devices. Non-limiting examples of the processor 304 include a Field-Programmable Gate Array ("FPGA"), an application-specific integrated circuit ("ASIC"), a microprocessor, etc.

The processor 304 can be communicatively coupled to the memory 308 via the bus 306. The non-volatile memory 308 may include any type of memory device that retains stored information when powered off. Non-limiting examples of the memory 308 include electrically erasable and programmable read-only memory ("EEPROM"), flash memory, or any other type of non-volatile memory. In some examples, at least some of the memory 308 can include a medium from which the processor 304 can read instructions. A computer-readable medium can include electronic, optical, magnetic, or other storage devices capable of providing the processor 304 with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C #, etc.

In some examples, the memory 308 can include a model 312. The model 312 can include one or more algorithms configured to predict a parameter associated with an environment in a well system or a wellbore operation (e.g., an operation of a well tool). The model 312 can be tuned for specific wellbore operations, such as rotary drilling, slide drilling, pulling a pipe out of a wellbore, running a pipe into the wellbore, circulating fluid through the well system, wellbore cleaning, or any combination of these. In some examples, the model 312 can include the equation:

$$\text{ECD Value} = \text{Total Pressure}/(0.052 * \text{TVD})$$

where ECD Value is a predicted ECD value in ppg (pounds per gallon) at a given depth for one or more fluids (e.g., Newtonian or Non-Newtonian fluids) in a wellbore; TVD (true vertical depth) is a vertical depth of a wellbore in feet; and Total Pressure is in psi (pounds per square inch). In some examples, the model 312 can include the following equation for determining the Total Pressure:

$$\text{Total Pressure} = \text{Hydrostatic Pressure} + \text{Annular Pressure Loss}$$

In some examples, the model 312 can include the following equation for determining the Hydrostatic Pressure:

$$\text{Hydrostatic Pressure} = 0.052 * \text{Mud Weight} * \text{TVD}$$

where hydrostatic pressure is in psi; and Mud Weight is in ppg and can be determined by applying temperature and pressure compressibility and expansion effects to a surface Mud Weight. The surface Mud Weight can be measured using a mud scale. In some examples, the model 312 can include the following equation for determining the Annular Pressure Loss:

$$\text{Annular Pressure Loss} = (4 * \text{Wall Shear Stress} * \text{Length})/(\text{Outer Diameter} - \text{Inner Diameter})$$

where annular pressure loss is in psi; wall shear stress is in psi and includes a fluid shear stress at a wall of an annulus of the wellbore; length is the length of the annulus of the wellbore in feet; outer diameter is the outer diameter of the annulus of the wellbore in feet; and inner diameter is the inner diameter of the annulus of the wellbore in feet.

In some examples, the computing device 120 can determine an input (e.g., a value for a variable) for an equation (e.g., any of the above equations) based on sensor data 314 from a sensor (e.g., real-time sensor data from sensor 118), data input to the computing device 120 by a well operator, historical data about a well system, or any combination of these. For example, the computing device 120 can receive sensor signals from a mud scale indicative of a surface Mud Weight, extract sensor data 314 from the sensor signals, and store the sensor data 314 in memory 308. The computing device 120 can retrieve the sensor data 314 from memory 308 and use the sensor data 314 as an input to, for example, a Hydrostatic Pressure equation. As another example, the computing device 120 can receive input from a well operator (e.g., indicative of an outer diameter of an annulus of a wellbore) and store the input as data in memory 308. The computing device 120 can retrieve the data from memory 308 and use the data as an input to, for example, an Annular Pressure Loss equation. As still another example, the computing device 120 can receive historical data about a well system and store the historical data in memory 308. The computing device 120 can retrieve the historical data and use at least a portion of the historical data as an input for an equation. In some examples, the computing device 120 can analyze the historical data to determine new information about the well system. The computing device 120 can use the new information as an input for an equation.

The memory 308 can also include sensor data 314 from a sensor 118. The sensor 118 can measure a parameter (associated with the environment in the well system or the wellbore operation) and transmit associated sensor signals to the computing device 120. The computing device 120 can receive the sensor signals via communication device 122, extract sensor data from the sensor signals, and store the sensor data 314 in memory 308. Examples of the sensors 118 can include a pressure sensor, a temperature sensor, a microphone, an accelerometer, a depth sensor, a resistivity sensor, a vibration sensor, a fluid analyzer or detector, an ultrasonic transducer, or any combination of these.

The memory 308 can also include one or more Δp values 318 (difference values). A Δp value 318 can be the difference between a predicted parameter (e.g., from the model 312) and a measured parameter (e.g., from the sensor 118). For example, the computing device 120 can compare a predicted value of the parameter to a measured value of the parameter to determine a difference between the two values. The difference can be the Δp value 318. The computing device can store the Δp value 318 in memory 308.

The computing device 120 can be in electrical communication with the communication device 122. The communication device 122 can include or can be coupled to an antenna 324. In some examples, part of the communication device 122 can be implemented in software. For example, the communication device 122 can include instructions stored in memory 308.

The communication device 122 can receive signals from remote devices (e.g., sensor 118) and transmit data to remote devices. For example, to transmit data to a remote device, the processor 304 can transmit one or more signals to the communication device 122. The communication device 122 can receive the signals from the processor 304 and amplify, filter, modulate, frequency shift, and otherwise manipulate the signals. The communication device 122 can transmit the manipulated signals to the antenna 324, which can responsively generate wireless signals that carry the data.

In some examples, the communication device 122 can transmit data via a wired interface. For example, the communication device 122 can transmit data via a wireline. As another example, the communication device 122 can generate an optical waveform. The communication device 122 can generate the optical waveform by pulsing a light emitting diode at a particular frequency. The communication device 122 can transmit the optical waveform via an optical cable (e.g., a fiber optic cable).

The computing device 120 can be in electrical communication with a display 310. The display 310 can receive signals from the processor 304 and output one or more associated images. For example, the display 310 can output a graph, such as the probability-mass distribution graph shown in FIGS. 5-17. Examples of the display 310 can include a television, a computer monitor, a liquid crystal display (LCD), or any other suitable display device.

The computing device 120 is in electrical communication with a power source 320. The power source 320 can additionally or alternatively be in electrical communication with the communication device 122, the sensor 118, or both. In some examples, the power source 320 can include a battery for powering the computing device 120, the communication device 122, or the sensor 118. In other examples, power source 320 can include an electrical cable, such as a wireline, to which the computing device 120 can be coupled.

In some examples, the power source 320 can include an AC signal generator. The computing device 120 can operate the power source 320 to apply a transmission signal to the antenna 324. For example, the computing device 120 can cause the power source 320 to apply a voltage with a frequency within a specific frequency range to the antenna 324. This can cause the antenna 324 to generate a wireless transmission. In other examples, the computing device 120, rather than the power source 320, can apply the transmission signal to the antenna 324 for generating the wireless transmission.

Figure 4:
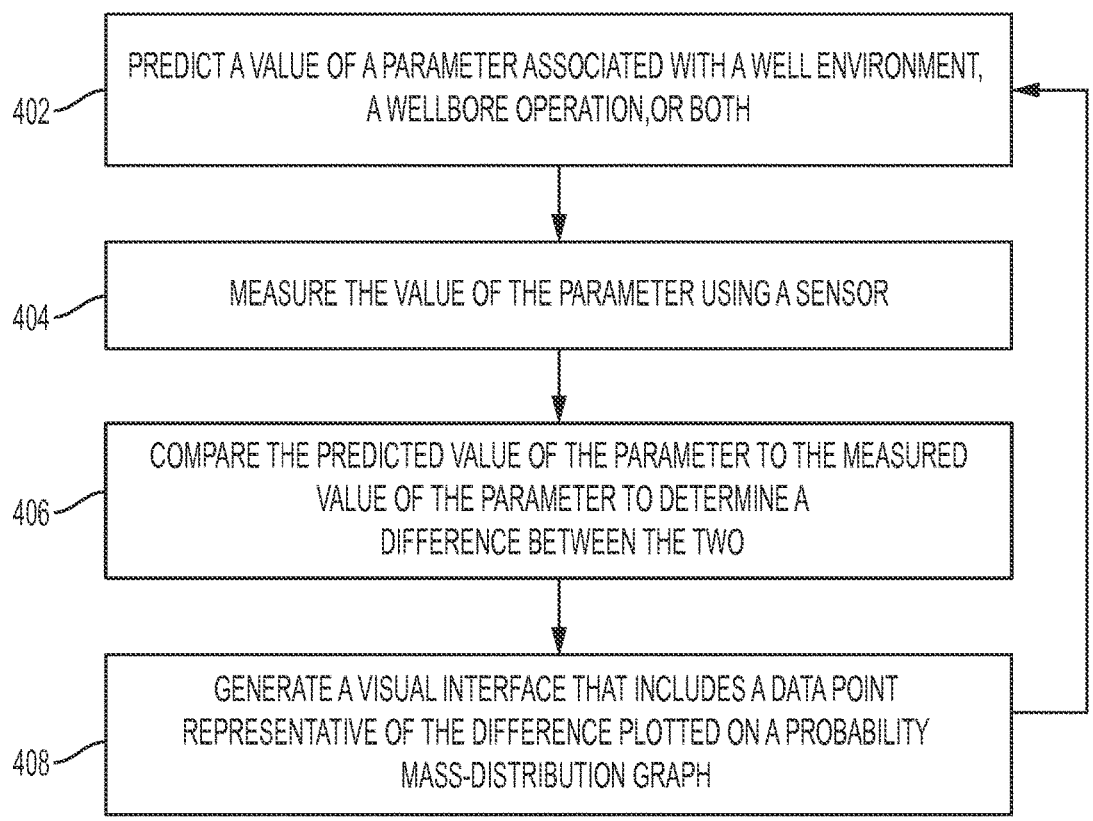
FIG. 4 is a flow chart of an example of a process for determining differences between downhole predictions and measured values according to some aspects.

FIG. 4 is a flow chart of an example of a process for determining differences between downhole predictions and measured values according to some aspects.

In block 402, the computing device 120 predicts a value of a parameter associated with a well environment, a wellbore operation, or both. For example, the computing device 120 can predict an equivalent circulating density (ECD) of a fluid in a wellbore, a stand pipe pressure (SPP), or both. The computing device 120 can use one or more models and apply one or more constraints to the models to predict the parameter of the well environment, the wellbore operation, or both. Examples of the constraints can include a known type of fluid in the wellbore, a depth of the wellbore, a temperature of the wellbore, a location of the wellbore, a characteristic of a subterranean formation out of which the wellbore is drilled, or any combination of these. In some examples, a user can input the constraints into the computing device 120 and the computing device 120 can store the constraints in memory (e.g., memory 308 of FIG. 3).

In block 404, the computing device 120 measures the value of the parameter (associated with the well environment, the wellbore operation, or both) using a sensor 118. The sensor 118 can detect one or more characteristics of the well environment, the wellbore operation (e.g., the operation of a well tool), or both and transmit an associated sensor signal to the computing device 120. The sensor signal can be an analog signal or a digital signal. For example, the sensor 118 can detect a pressure while drilling (PWD) during a drilling operation in a wellbore and transmit an associated sensor signal to the computing device 120. The computing device 120 can receive the sensor signal and extract sensor data from the sensor signal.

In block 406, the computing device 120 compares the predicted value of the parameter to the measured value of the parameter to determine a difference between the two. For example, the computing device 120 can subtract (e.g., remove) the predicted ECD value from the measured PWD value to determine a difference between the two. As another example, the computing device 120 can subtract the predicted SPP value from the measured SPP value to determine a difference between the two. The computing device 120 can store the differences (e.g., between the predicted ECD value and the measured PWD value, between the predicted SPP value and the measured SPP value, or both) in memory.

In block 408, the computing device 120 generates a visual interface that includes a data point representative of the difference (between the predicted value of the parameter and the measured value of the parameter) plotted on a probability-mass distribution graph. The computing device 120 can output the visual interface on a display (e.g., display 310 of FIG. 3). A well operator can visually inspect the probability-mass distribution graph determine the accuracy of the predicted value of the parameter.

Figure 5:
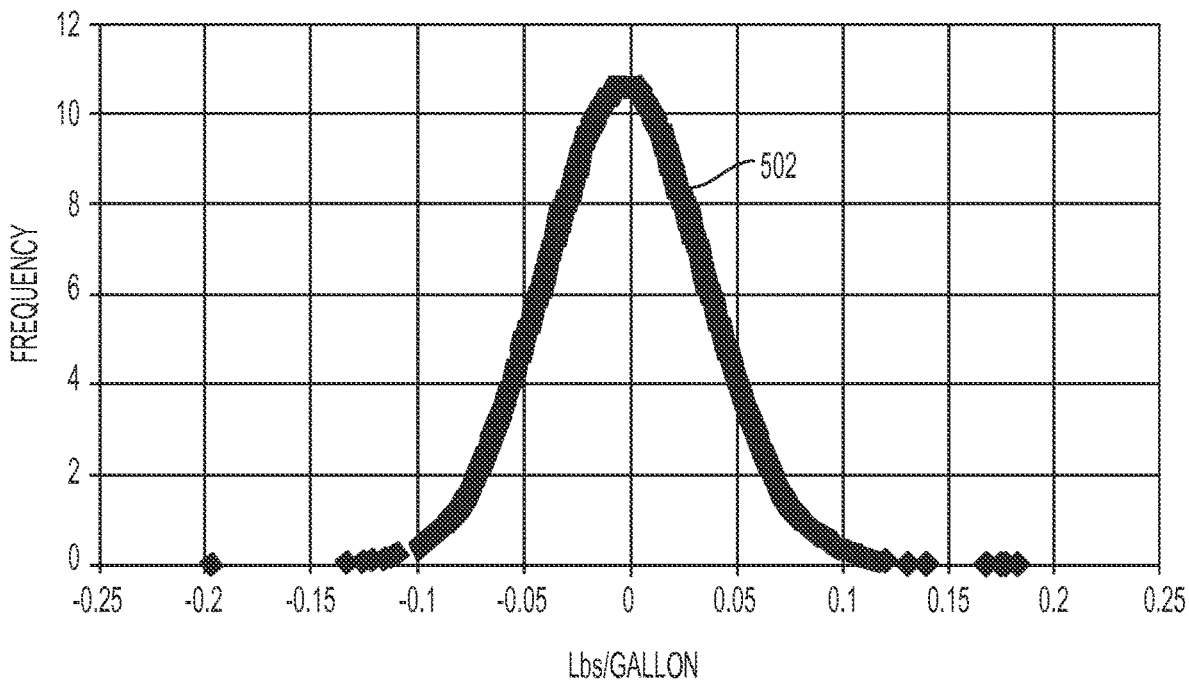
FIG. 5 is a graph depicting a probability-mass distribution generated using predicted equivalent circulating density (ECD) values according to some aspects.
Figure 6:
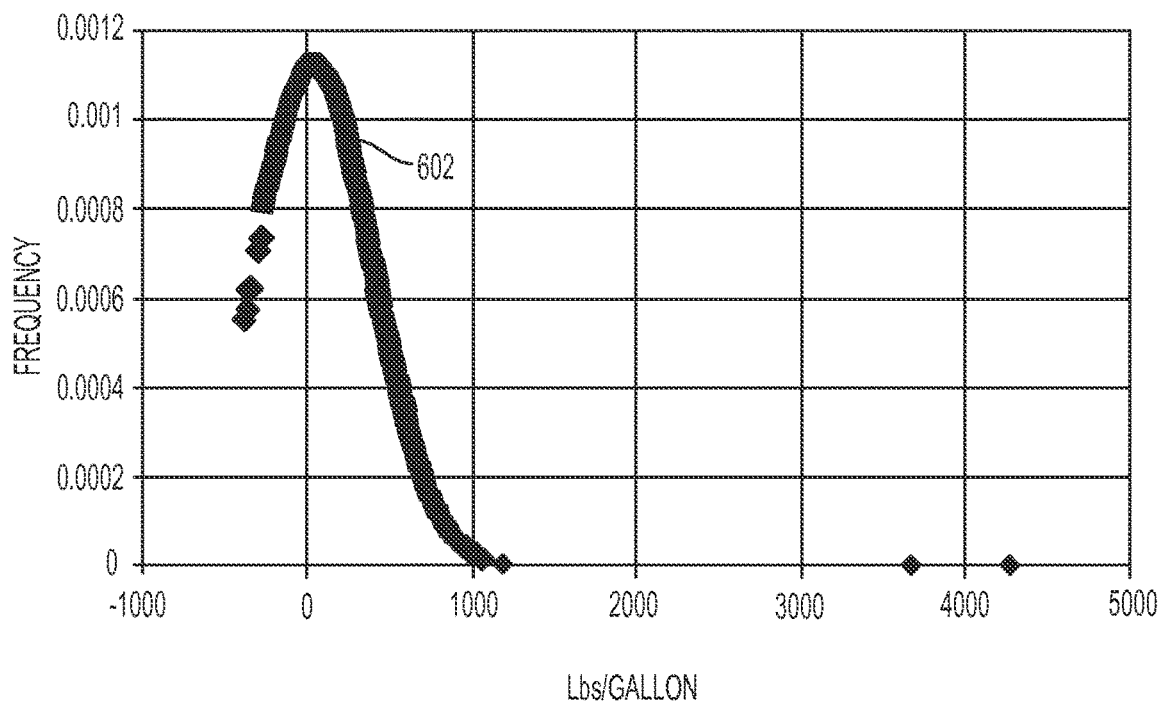
FIG. 6 is a graph depicting a probability-mass distribution generated using predicted stand pipe pressure (SPP) values according to some aspects.
Figure 7:
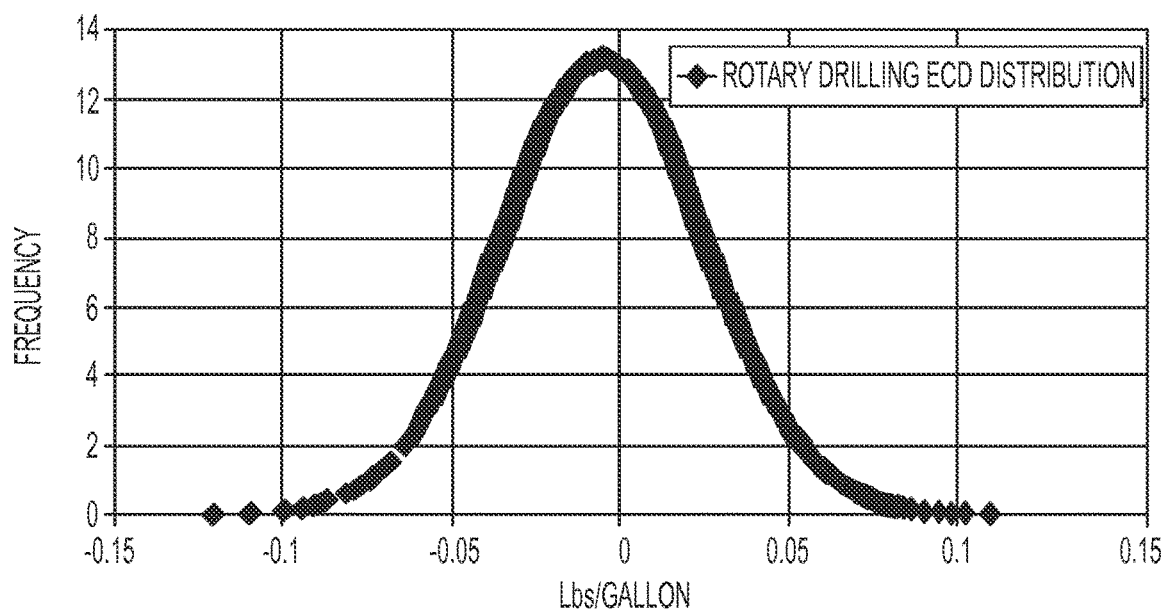
FIG. 7 is a graph depicting a probability-mass distribution generated using predicted ECD values tuned for a rotary drilling wellbore operation according to some aspects.
Figure 8:
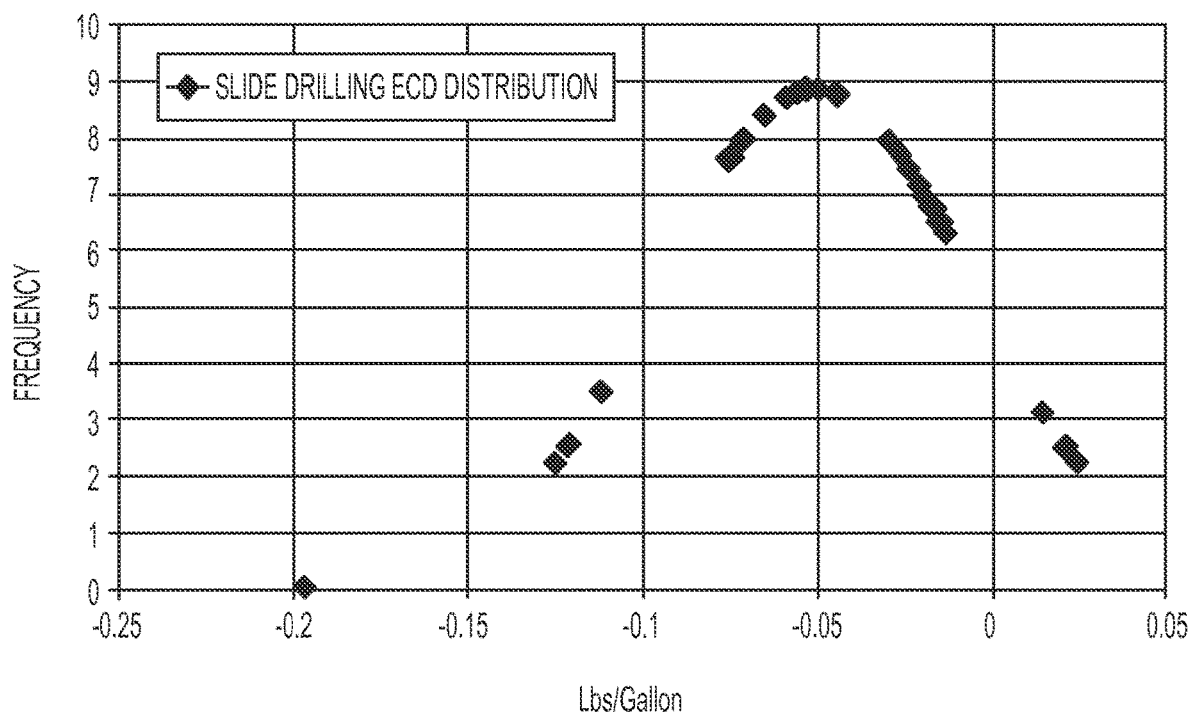
FIG. 8 is a graph depicting a probability-mass distribution generated using predicted ECD values tuned for a slide drilling wellbore operation according to some aspects.
Figure 9:
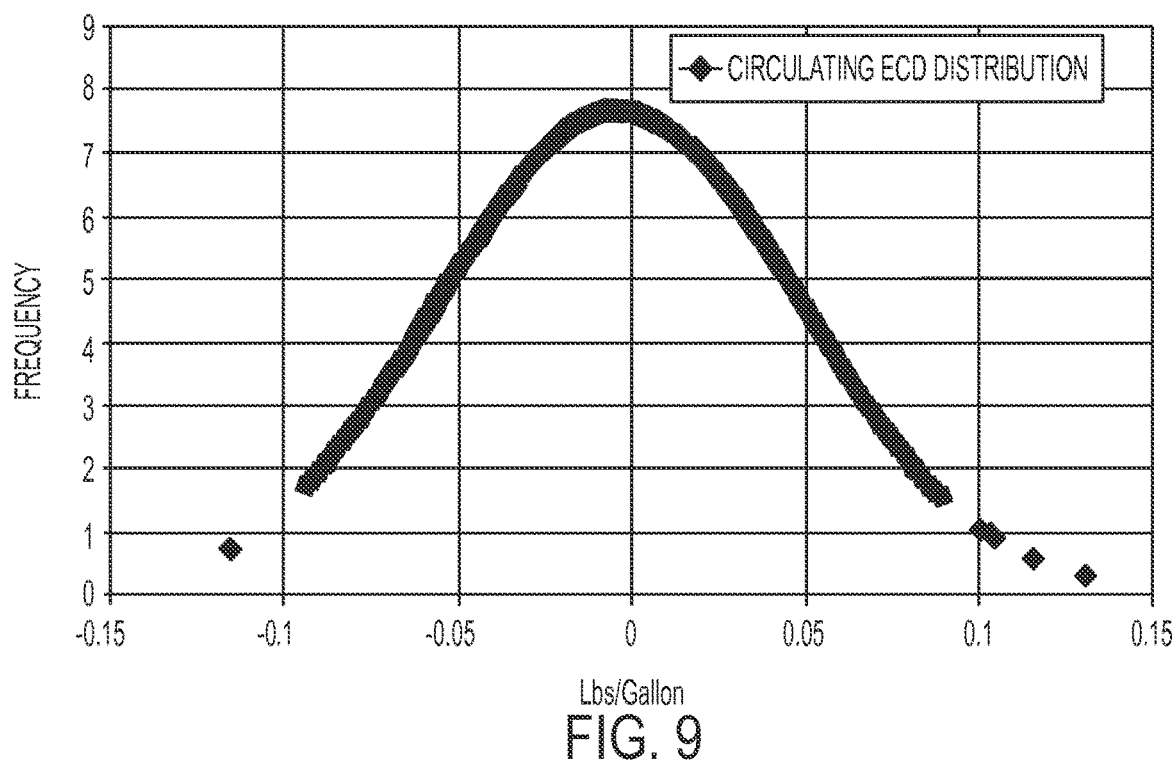
FIG. 9 is a graph depicting a probability-mass distribution generated using predicted ECD values tuned for a circulating wellbore operation according to some aspects.
Figure 10:
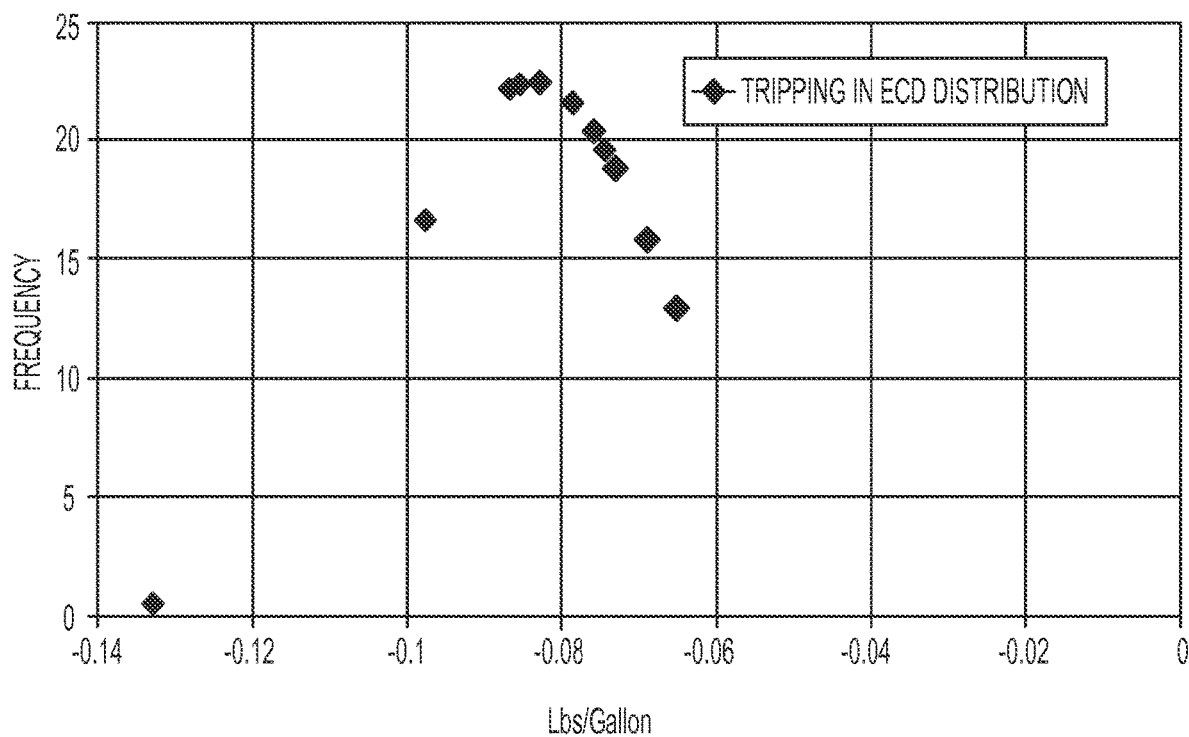
FIG. 10 is a graph depicting a probability-mass distribution generated using predicted ECD values tuned for a tripping-in wellbore operation according to some aspects.
Figure 11:
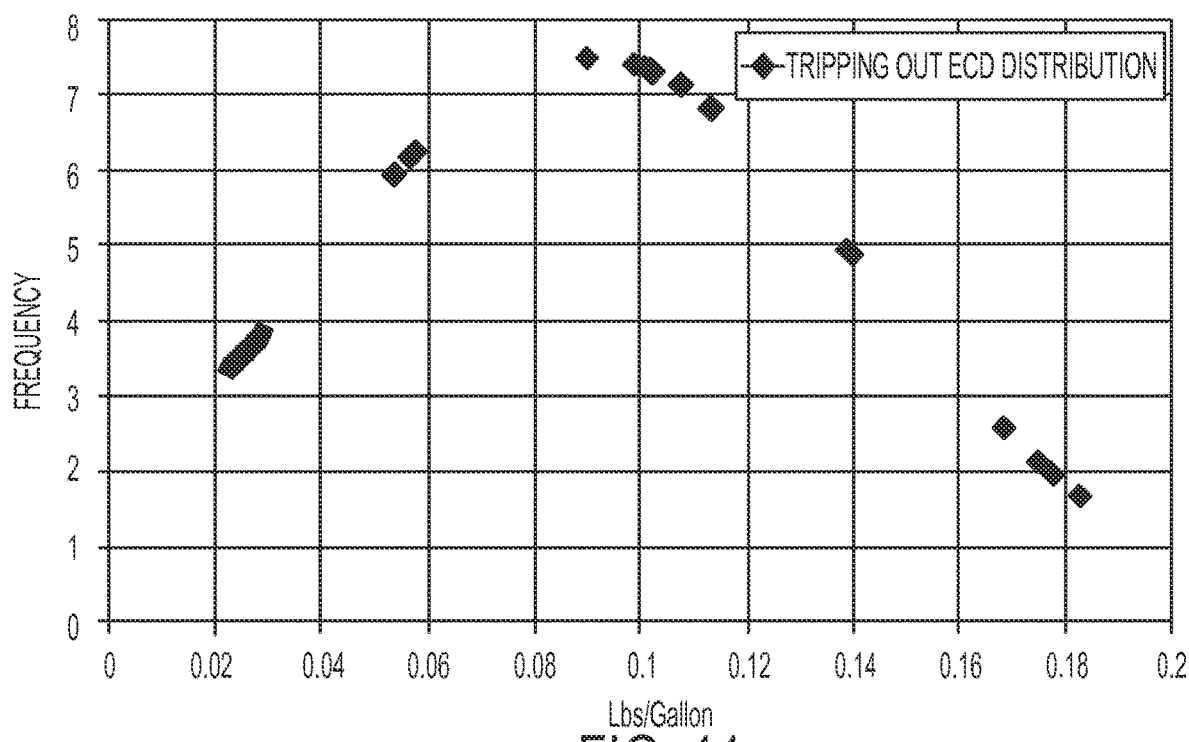
FIG. 11 is a graph depicting a probability-mass distribution generated using predicted ECD values tuned for a tripping-out wellbore operation according to some aspects.
Figure 12:
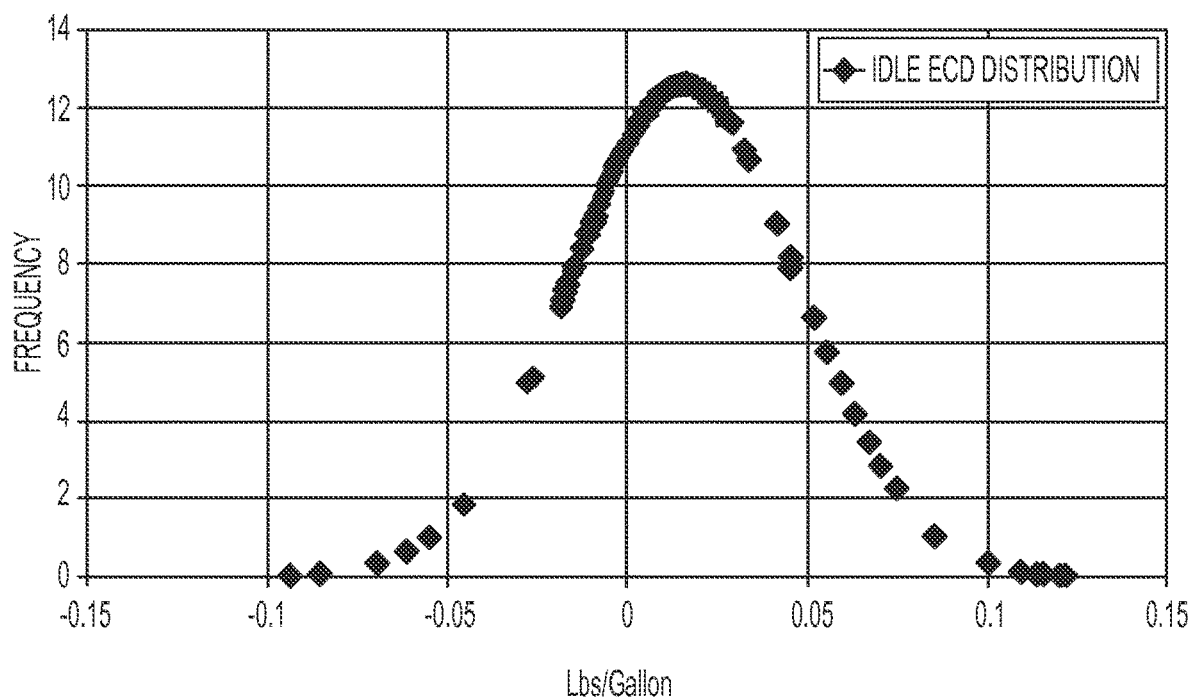
FIG. 12 is a graph depicting a probability-mass distribution generated using predicted ECD values tuned for an idle wellbore operation according to some aspects.
Figure 13:
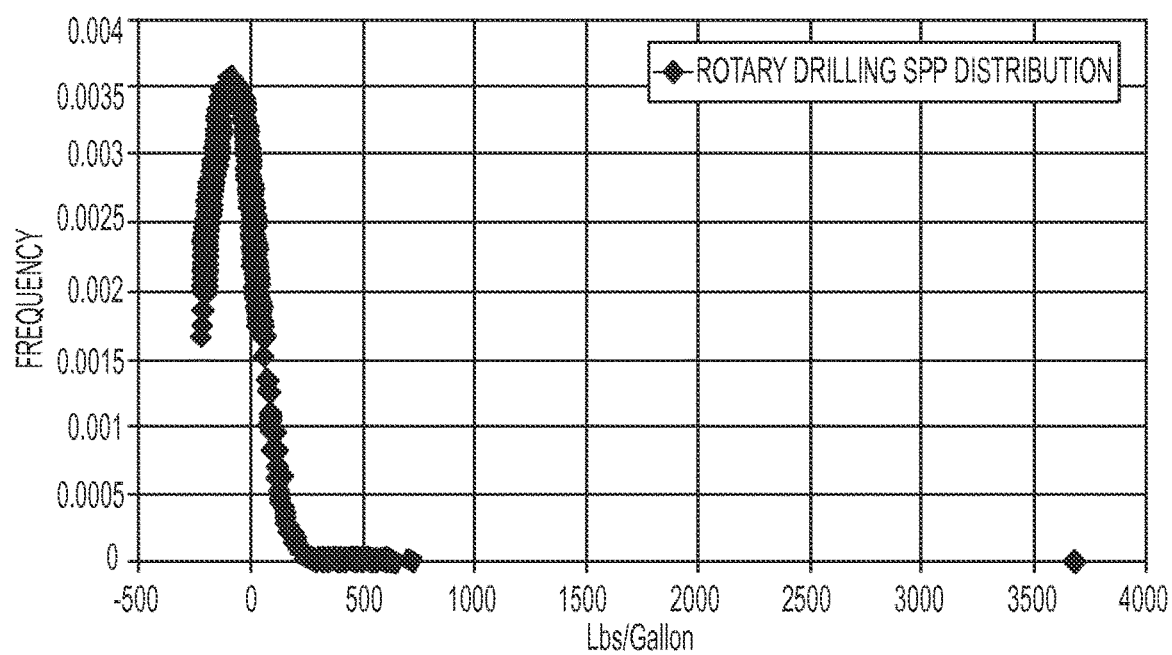
FIG. 13 is a graph depicting a probability-mass distribution generated using predicted SPP values tuned for a rotary drilling wellbore operation according to some aspects.
Figure 14:
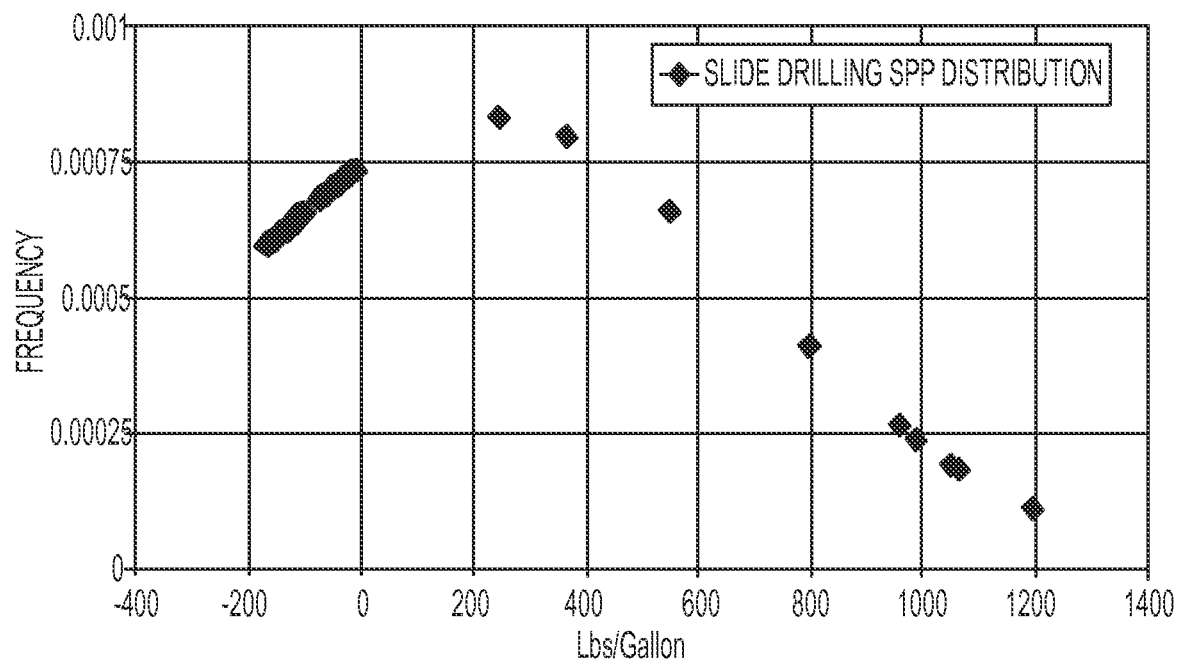
FIG. 14 is a graph depicting a probability-mass distribution generated using predicted SPP values tuned for a slide drilling wellbore operation according to some aspects.
Figure 15:
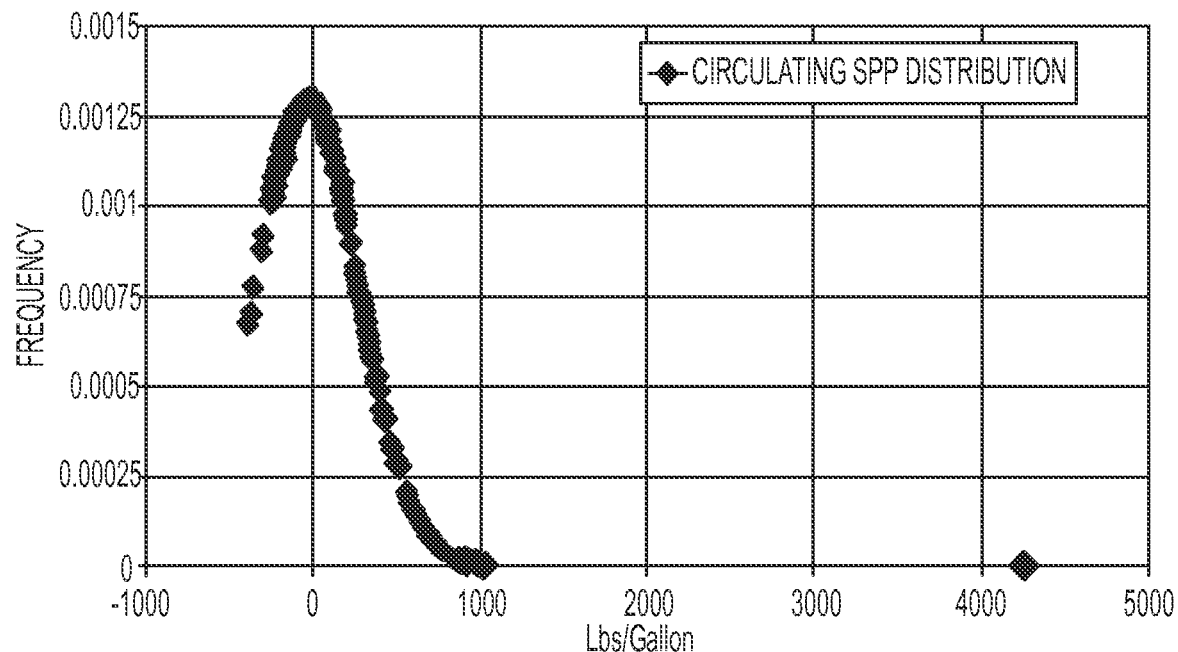
FIG. 15 is a graph depicting a probability-mass distribution generated using predicted SPP values tuned for a circulating wellbore operation according to some aspects.
Figure 16:
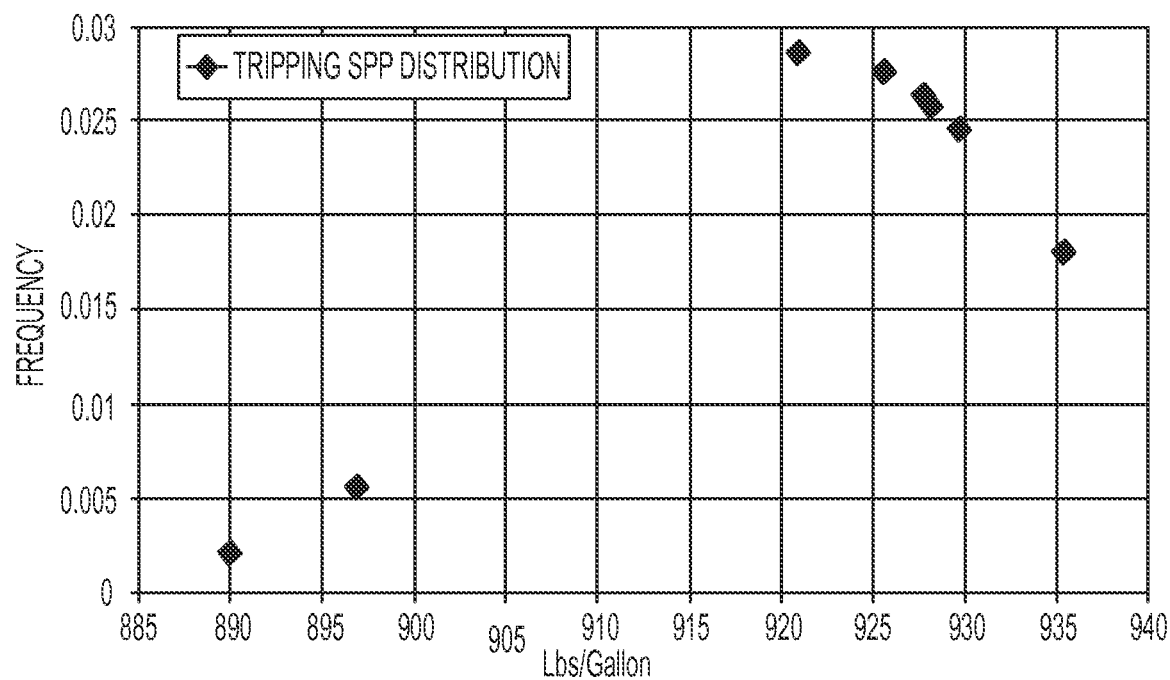
FIG. 16 is a graph depicting a probability-mass distribution generated using predicted SPP values tuned for a tripping-in wellbore operation according to some aspects.
Figure 17:
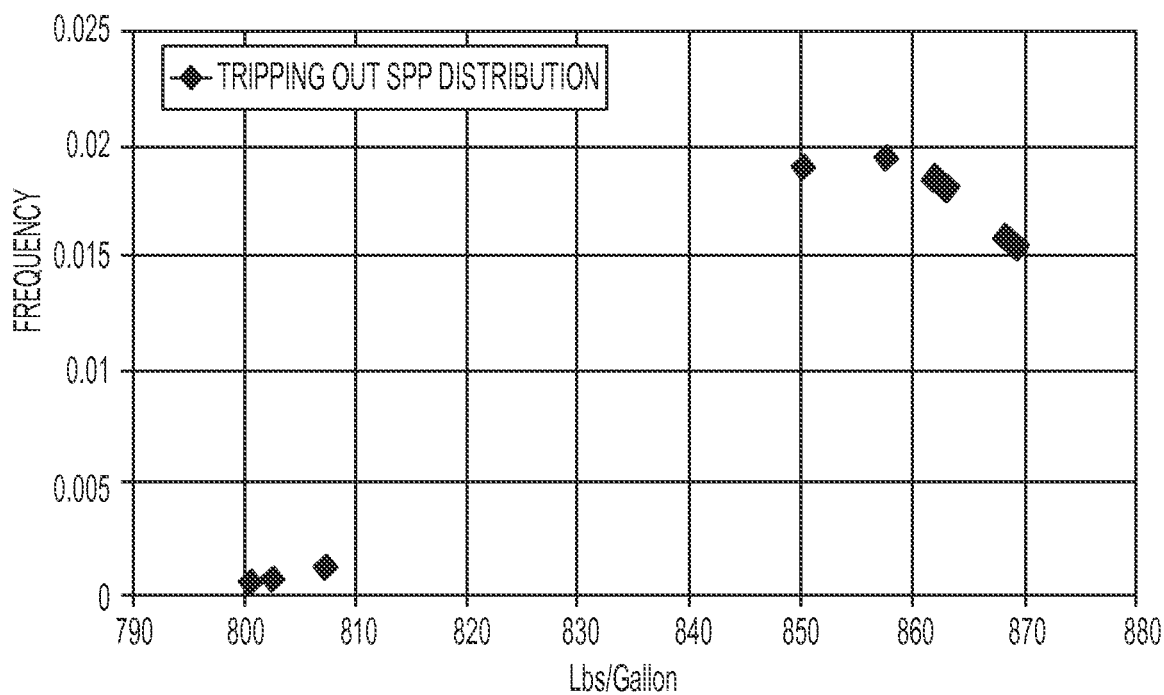
FIG. 17 is a graph depicting a probability-mass distribution generated using predicted SPP values tuned for a tripping-out wellbore operation according to some aspects.

For example, FIG. 5 shows an example of a probability-mass distribution curve 502 generated using multiple predicted ECD values. FIG. 6 shows an example of a probability-mass distribution curve 602 generated using multiple predicted SPP values. The data point can be plotted along the probability-mass distribution curve 502, 602. The process can return to block 402 and iterate the steps of blocks 402-408 to generate multiple data points and plot the data points on the probability-mass distribution curve 502, 602. In some examples, the data points can have a substantially normal distribution. The probability-mass distribution curve 502, 602 can represent the accuracy of predicted values associated with the data points. A well operator can visually inspect the probability-mass distribution curve 502, 602 to determine the accuracy of the predicted values.

In some examples, the computing device 120 can tune the predicted value of the parameter for specific wellbore operations. For example, FIGS. 7-12 show probability-mass distribution graphs generated using predicted ECD values that are tuned for various wellbore operations. FIGS. 13-17 show probability-mass distribution graphs generated using predicted SPP values that are tuned for various wellbore operations.

In some examples, the computing device 120 can analyze a probability-mass distribution graph, the associated data points, or both to determine a source of a difference between the predicted value of the parameter and the measured parameter. For example, the computing device 120 can determine that the difference is due to an event occurring in the wellbore, an error with a model that generated the predicted value of the parameter, an error with data input by a user, an equipment failure, or any combination of these. The computing device 120, the well operator, or both can perform one or more processes or tasks based on the source of the difference. The processes or tasks can be selected to correct the error or otherwise reduce the difference between the predicted parameter and the measured parameter.

Figure 18:
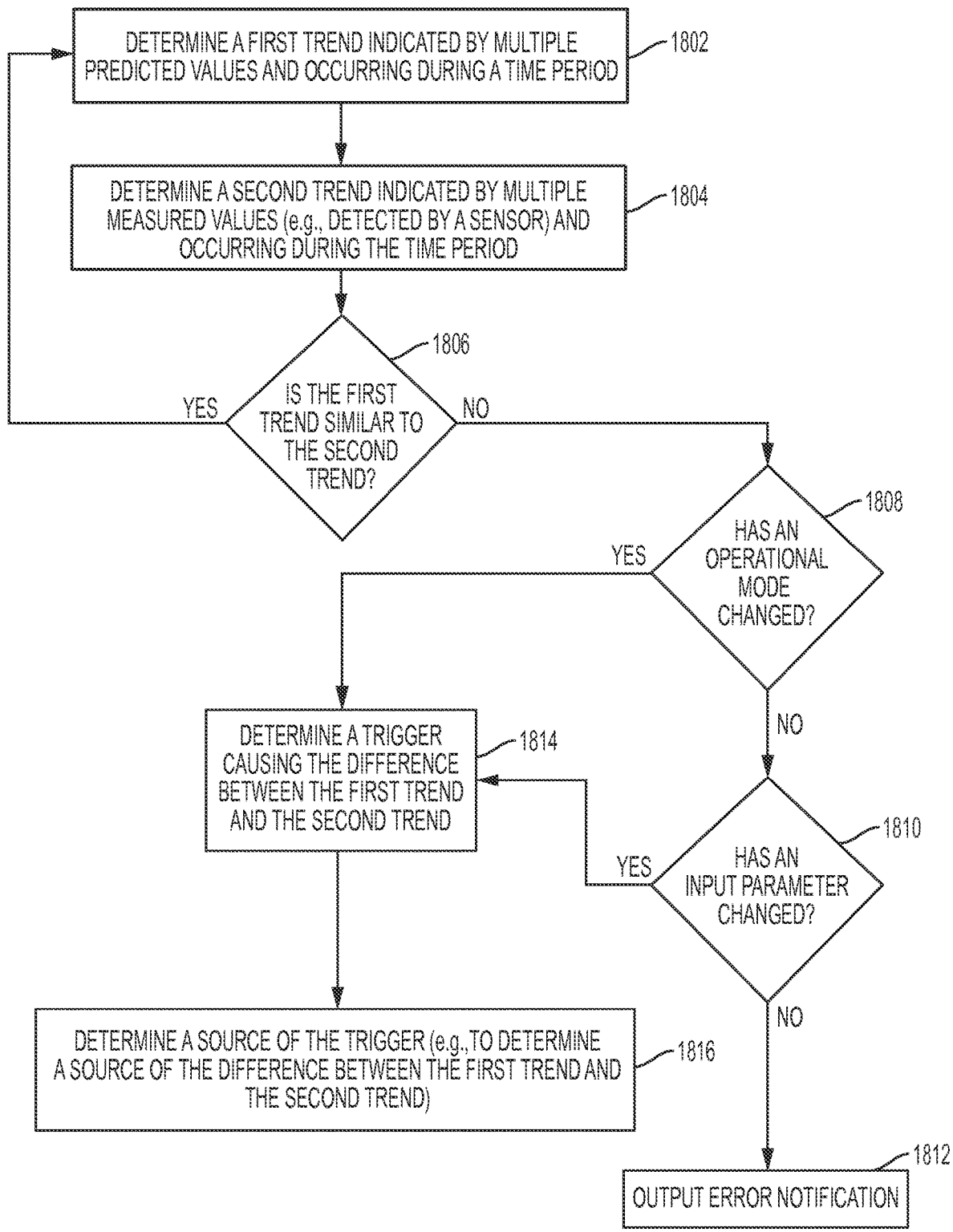
FIG. 18 is a flow chart of an example of a process for determining sources of erroneous downhole predictions according to some aspects.

FIG. 18 is a flow chart of an example of a process for determining sources of erroneous downhole predictions according to some aspects.

In block 1802, the computing device 120 determines a first trend indicated by multiple predicted values of a parameter and occurring during a time interval. For example, the computing device 120 can analyze the multiple predicted values to determine that the predicted values are increasing, staying substantially the same, or decreasing over the time interval.

In block 1804, the computing device 120 determines a second trend indicated by multiple measured values (e.g., detected by a sensor) and occurring during the time interval. For example, the computing device 120 can analyze the multiple measured values to determine that the predicted values are increasing, staying substantially the same, or decreasing over the time interval.

In block 1806, the computing device 120 determines if the first trend is similar to the second trend. The first trend can be similar to the second trend if one or more characteristics of the first trend are within a predefined threshold of one or more characteristics of the second trend. For example, if the first trend includes the predicted values increasing by an amount less than a threshold, and the second trend includes the measured values increasing by another amount less than the threshold, the first trend can be similar to the second trend.

In some examples, the computing device 120 can determine if the first trend is similar to the second trend based on a difference between one or more of the predicted values and one or more of the measured values. For example, the computing device 120 can determine if a difference between a predicted value and a measured value exceeds a threshold. If the difference exceeds the threshold, the computing device 120 can determine that the first trend is not similar to the second trend. In some examples, the computing device 120 can additionally or alternatively determine if a rate of change of a difference between multiple predicted values and multiple measured values exceeds a threshold. If the rate of change of the difference exceeds the threshold, the computing device 120 can determine that the first trend is not similar to the second trend.

If the first trend is similar to the second trend, the process can return to block 1802. If the first trend is different from the second trend, the process can continue to block 1808.

In block 1808, the computing device 120 determines if an operational mode of a well tool changed. In some examples, an operational mode can include a mode of operation or a status of a well tool in a wellbore. For example, an operational mode can include a drilling status of a rotary drilling tool in the wellbore. In some examples, an operational mode can include performing rotary drilling, performing slide drilling, circulation or hole cleaning, making a connection between two well components, idling, tripping in, tripping out, or any combination of these.

The computing device 120 can determine the operational mode based on sensor data from one or more sensors (e.g., proximate to the wellbore). Examples of the sensor data can include a depth of a drill bit in a wellbore, a depth of the wellbore, a pump rate, a rotation speed of a pipe, a translation speed of a pipe, or any combination of these. For example, the computing device 120 can determine that the operational mode includes drilling in response to detecting, using one or more sensors, that a depth of a drill bit in a wellbore is within one foot of a bottom of the wellbore, a rotation rate of a drill tool is greater than zero, a flow rate of a fluid is greater than zero, or any combination of these.

If the computing device 120 determines that the operational mode changed, the process continues to block 1814. Otherwise, the process continues to block 1810.

In block 1810, the computing device 120 determines if an input parameter (e.g., a parameter provided to a model executing on the computing device 120 by a user or sensor) changed. For example, the computing device 120 can compare the input parameter during the time interval to the input parameter during a previous time interval to determine a difference between the two. If there is a difference between the two, the computing device 120 can determine that the input parameter changed.

If the computing device 120 determines that an input parameter changed, the process continues to block 1814. Otherwise, the process continues to block 1812.

In block 1812, the computing device 120 outputs an error notification. The error notification can include a sound, a visual effect, a tactile effect, or any combination of these. In some examples, the error notification can alert the well operator that there are divergent trends between the predicted values of a parameter and the measured values of the parameter. The error notification can additionally or alternatively indicate that the difference is not due to a change in an operational mode (e.g., of a well tool), an input parameter, or both.

In block 1814, the computing device 120 determines a trigger causing the difference between the first trend and the second trend based on a change in an operational mode, a change in an input parameter, or both. In some examples, the computing device 120 can implement one or more workflows, processes, or tasks to determine the trigger. For example, the first trend, the second trend, or both can be related to or depend on the operational mode, the input parameter, or both. The computing device 120 can include (e.g., stored in memory 308 of FIG. 3) one or more lookup tables and/or algorithms indicating or representing known relationships between predicted values, measured values, input parameters, and/or operational modes. The computing device 120 can use the lookup tables or algorithms to determine if any known relationships have been violated. In response to detecting that a known relationship has been violated, the computing device 120 can determine that the trigger includes, at least in part, the violation.

For example, the set of predicted values can include ECD predictions that increased over a time period and the set of measured values can include PWD values that remained substantially constant over the time period. To determine a trigger causing the difference between the ECD predictions and the PWD values, the computing device 120 can determine if an operational mode changed or an input parameter changed (e.g., as discussed with respect to blocks 1808 and 1810). The computing device 120 can determine that an input parameter including a temperature value increased during the time period. The computing device 120 can use a lookup table to determine that there is a proportional relationship between temperature values and PWD values. The computing device 120 can further determine that the combination of substantially constant PWD values and increasing temperature values during the time period violates the proportional relationship. This violation can indicate that there is an error in the measured PWD values or the temperature values. In some examples, the computing device 120 can be unable to determine an exact trigger, but can identify multiple potential triggers (e.g., such as the error being in the measured PWD values or the temperature values).

In other examples, the computing device 120 can determine the exact trigger. For example, the computing device 120 can determine a set of predicted values that includes ECD predictions that increased over a time period, a set of measured values that includes PWD values that remained substantially constant over the time period, that an input parameter (e.g., a mud density temperature input by a user) changed over the time period, and that the operational mode remained substantially constant over the time period. In some examples, the computing device 120 can determine that the increasing ECD predictions were triggered by an incorrect input parameter. The computing device 120 can determine that the increasing ECD predictions were triggered by the incorrect input parameter, because the input parameter changed over the time period, while the measured PWD values and the operational mode remained substantially constant.

In block 1816, the computing device 120 determines a source of the trigger (e.g., to determine a source of the difference between the first trend in the second trend). In some examples, the computing device 120 can perform the process shown in FIG. 19 to determine the source of the trigger.

Figure 19:
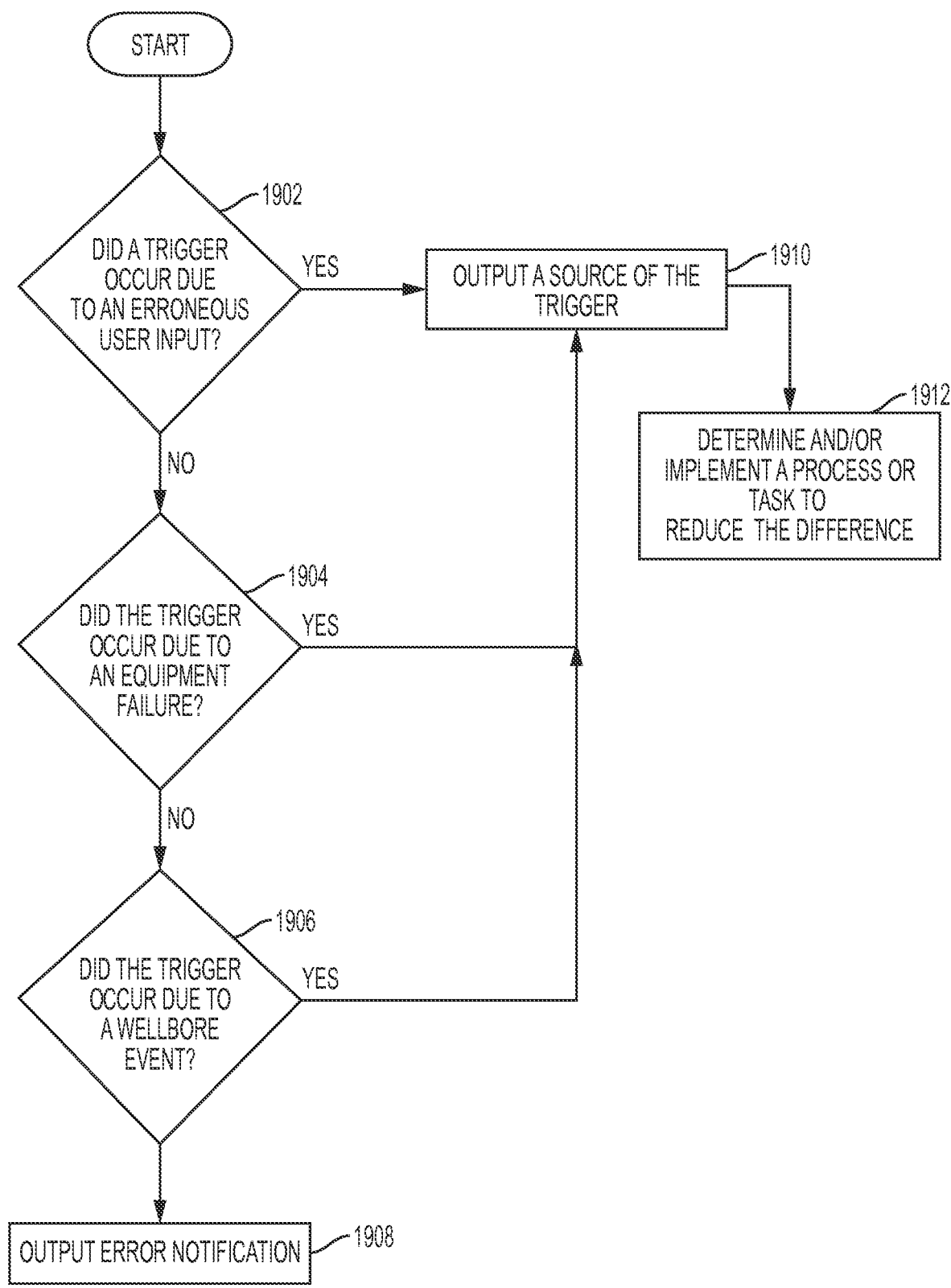
FIG. 19 is a flow chart of an example of a process for determining a source of a difference between two trends according to some aspects.

Referring now to FIG. 19, in block 1902, the computing device 120 determines if the trigger occurred due to an erroneous user input. For example, if the trigger is an input parameter including an erroneous temperature measurement, the computing device 120 can determine if the erroneous temperature measurement was provided by a user. In some examples, the computing device 120 can determine if the input parameter was provided by a user or by a sensor. For example, the computing device 120 can perform a system check to determine if a temperature sensor is coupled to the computing device 120. The computing device 120 can determine that the input parameter was provided by a user in response to detecting the absence of the temperature sensor, or that the input parameter was provided by the sensor in response to detecting the presence of the temperature sensor.

In some examples, the computing device 120 can prompt the user to determine whether an input parameter was provided by the user or another source. For example, the computing device 120 can prompt the user (e.g., via a graphical user interface component) to provide input indicating whether the input parameter was provided by the user or another source (e.g., a sensor).

If the computing device 120 determines that trigger occurred due to the erroneous user input, the process continues to block 1910. Otherwise, the process continues to block 1904.

In block 1904, the computing device 120 determines if the trigger occurred due to equipment failure. For example, if the trigger is an input parameter including an erroneous temperature measurement, the computing device 120 can determine if the erroneous temperature measurement was provided by hardware (e.g., a sensor 118 of FIG. 3). In some examples, the computing device 120 can determine if the input parameter was provided by a user or by a sensor. For example, the computing device 120 can perform a system check to determine if a temperature sensor is coupled to the computing device 120. The computing device 120 can determine that the input parameter was provided by the temperature sensor in response to detecting the presence of the temperature sensor, or that the input parameter was not provided by the temperature sensor in response to detecting the absence of the temperature sensor. Thus, the computing device 120 can determine that the trigger was due to a faulty temperature sensor.

In some examples, the computing device 120 can prompt the user to determine whether an input parameter was provided by hardware or another source. For example, the computing device 120 can prompt the user (e.g., via a graphical user interface component) to provide input indicating whether the input parameter was provided by hardware or the user.

In some examples, the equipment failure can include an error in a model executing on the computing device 120. In some examples, the computing device 120 can determine if there is an error in the model by analyzing Δp values associated with two or more different wellbore operations. For example, the computing device 120 can determine that a set of Δp values associated with a tripping operation are larger than another set of Δp values associated with a drilling operation. The computing device 120 can further determine that no event is occurring in the wellbore and that the user has input all data correctly into the model. The combination of these determinations can indicate that there is an error in the model.

If the computing device 120 determines that trigger occurred due to equipment failure, the process continues to block 1910. Otherwise, the process continues to block 1906.

In block 1906, the computing device 120 determines if the trigger occurred due to a wellbore event. The computing device 120 can determine if the event occurred based on sensor data (e.g., from sensor 118 of FIG. 3). For example, the computing device 120 can determine if an amount of pressure in the wellbore, a temperature in the wellbore, or another environmental condition in the wellbore has changed in an amount above a threshold. In some examples, the event can include a well tool operating or failing to operate in a particular manner. For example, the event can include a bit nozzle for a drilling tool becoming blocked.

In some examples, the computing device 120 can determine if the event occurred by analyzing Δp values associated with two or more different wellbore operations (e.g., stored in memory 308 of FIG. 3). For example, the computing device 120 can determine a first Δp value on the SPP probability-mass distribution graph of FIG. 6. The first Δp value can substantially deviate from the probability-mass distribution curve 602. The computing device 120 can substantially simultaneously determine a second Δp value on the ECD probability-mass distribution graph of FIG. 5. The second Δp values can substantially adhere to the probability-mass distribution curve 502. The deviation of the first Δp value from the probability-mass distribution curve 602 in conjunction with the adherence of the second Δp value with the probability-mass distribution curve 502 can indicate a particular downhole event has occurred. For example, the computing device 120 can determine that, based on the deviation of the first Δp value from the probability-mass distribution curve 602, and the conformity of the second Δp value with the probability-mass distribution curve 502, there is a blocked bit nozzle.

If the computing device 120 determines that trigger occurred due to a wellbore event, the process continues to block 1910. Otherwise, the process continues to block 1908.

In block 1908, the computing device 120 outputs an error notification. The error notification can include a sound, visual effect, a tactile effect, or any combination of these. In some examples, the error notification can alert the well operator that the trigger is not due to an erroneous user input, an equipment failure, and/or a wellbore event. The error notification can indicate that the source of the error is unknown.

In block 1910, the computing device 120 outputs a source of the trigger. For example, the computing device 120 can output a notification. The notification can indicate that the source of the trigger includes an erroneous user input, an equipment failure, and/or a wellbore event. The notification can additionally or alternatively include more specific information regarding the source of the trigger (e.g., the specific erroneous user input, piece of equipment that failed, or wellbore event that occurred).

In block 1912, the computing device 120 determines a process or task for reducing a difference between a first trend associated with a set of predicted values and a second trend associated with a set of measured values (e.g., from FIG. 18). The computing device 120 then implements the process or task.

For example, if the difference between the first trend and the second trend is due to incorrect data input by the user, the process or task can include the computing device 120 prompting the user for new data. The computing device 120 can receive the new data from the user and apply the new data to the model. As another example, if the difference between the first trend and the second trend is due to an event occurring in the wellbore, the computing device 120 can modify a parameter of the model to account for the event, execute a new model, prompt the user for action, or any combination of these. As still another example, if the difference between the first trend and the second trend is due to an error in the model, the computing device 120 can modify a parameter of the model, execute a new model, alert the user to the error in the model, or any combination of these.

In some aspects, systems, methods, and computer-readable media for determining sources of erroneous downhole predictions are provided according to one or more of the following examples:

EXAMPLE #1

A system for use in a wellbore can include a computing device including a processing device and a memory device in which instructions executable by the processing device are stored. The instructions can be for causing the processing device to generate, using a model, multiple predicted values of a first parameter associated with a well environment or with a wellbore operation. The instructions can be for causing the processing device to determine a first trend indicated by the multiple predicted values and occurring during a time period. The instructions can be for causing the processing device to receive, from a sensor, multiple measured values of a second parameter associated with the well environment or with the wellbore operation. The instructions can be for causing the processing device to determine a second trend indicated by the multiple measured values and occurring during the time period. The instructions can be for causing the processing device to determine a difference between the first trend and the second trend or a rate of change of the difference between the first trend and the second trend. The instructions can be for causing the processing device to, in response to the difference exceeding a first threshold or the rate of change exceeding a second threshold, determine a source of the difference including at least one of an erroneous user input, an equipment failure, a wellbore event, or a model error.

EXAMPLE #2

The system of Example #1 may feature the memory device including instructions executable by the processing device for causing the processing device to determine the source of the difference by determining a trigger causing the difference between the first trend and the second trend using a lookup table.

EXAMPLE #3

The system of Example #2 may feature the memory device including instructions executable by the processing device for causing the processing device to determine the trigger causing the difference between the first trend and the second trend using the lookup table by: determining, using the lookup table, a relationship between at least two of the first parameter, the second parameter, and a third parameter associated with the well environment or with the wellbore operation; and determining the trigger includes a violation of the relationship between the at least two of the first parameter, the second parameter, and the third parameter. The memory device can also include instructions executable by the processing device for causing the processing device to determine that the source of the difference is the erroneous user input, the equipment failure, the wellbore event, or the model error based on the trigger.

EXAMPLE #4

The system of any of Examples #1-3 may feature the memory device including instructions executable by the processing device for causing the processing device to determine that the source of the difference includes the erroneous user input in response to determining that an input parameter usable by the model to generate the multiple predicted values was provided by a user; or determine that the source of the difference includes the equipment failure in response to determining that the input parameter usable by the model to generate the multiple predicted values was provided by another sensor.

EXAMPLE #5

The system of any of Examples #1-4 may feature the memory device including instructions executable by the processing device for causing the processing device to determine that the source of the difference includes the wellbore event based on a change in data from another sensor positioned proximately to the wellbore.

EXAMPLE #6

The system of any of Examples #1-5 may feature the memory device including instructions executable by the processing device for causing the processing device to output the source of the difference between the first trend and the second trend; select a process for reducing the difference between the first trend and the second trend based on the source of the difference; and implement the process.

EXAMPLE #7

The system of any of Examples #1-6 may feature the wellbore event including a change in an environmental condition in the wellbore, a well tool operating in a specific manner, or the well tool failing to operate in a particular manner.

EXAMPLE #8

A method can include generating, using a model, multiple predicted values of a first parameter associated with a well environment or with a wellbore operation. The method can include determining a first trend indicated by the multiple predicted values and occurring during a time period. The method can include receiving, from a sensor, multiple measured values of a second parameter associated with the well environment or with the wellbore operation. The method can include determining a second trend indicated by the multiple measured values and occurring during the time period. The method can include determining a difference between the first trend and the second trend or a rate of change of the difference between the first trend and the second trend. The method can include, in response to the difference exceeding a first threshold or the rate of change exceeding a second threshold, determining a source of the difference including at least one of an erroneous user input, an equipment failure, a wellbore event, or a model error.

EXAMPLE #9

The method of Example #8 may feature determining the source of the difference by determining a trigger causing the difference between the first trend and the second trend using a lookup table.

EXAMPLE #10

The method of Example #9 may feature determining the trigger causing the difference between the first trend and the second trend using the lookup table by: determining, using the lookup table, a relationship between at least two of the first parameter, the second parameter, and a third parameter associated with the well environment or with the wellbore operation; and determining the trigger includes a violation of the relationship between the at least two of the first parameter, the second parameter, and the third parameter. The method may also feature determining that the source of the difference is the erroneous user input, the equipment failure, the wellbore event, or the model error based on the trigger.

EXAMPLE #11

The method of any of Examples #8-10 may feature determining that the source of the difference includes the erroneous user input in response to determining that an input parameter usable by the model to generate the multiple predicted values was provided by a user; or determining that the source of the difference includes the equipment failure in response to determining that the input parameter usable by the model to generate the multiple predicted values was provided by another sensor.

EXAMPLE #12

The method of any of Examples #8-11 may feature determining that the source of the difference includes the wellbore event based on a change in data from another sensor positioned proximately to a wellbore, wherein the wellbore event includes another change in an environmental condition in the wellbore, a well tool operating in a specific manner, or the well tool failing to operate in a particular manner.

EXAMPLE #13

The method of any of Examples #8-12 may feature outputting the source of the difference between the first trend and the second trend; selecting a process for reducing the difference between the first trend and the second trend based on the source of the difference; and implementing the process.

EXAMPLE #14

A non-transitory computer readable medium can include program code that is executable by a processor to cause the processor to generate, using a model, multiple predicted values of a first parameter associated with a well environment or with a wellbore operation. The program code can cause the processor to determine a first trend indicated by the multiple predicted values and occurring during a time period. The program code can cause the processor to receive, from a sensor, multiple measured values of a second parameter associated with the well environment or with the wellbore operation. The program code can cause the processor to determine a second trend indicated by the multiple measured values and occurring during the time period. The program code can cause the processor to determine a difference between the first trend and the second trend or a rate of change of the difference between the first trend and the second trend. The program code can cause the processor to, in response to the difference exceeding a first threshold or the rate of change exceeding a second threshold, determine a source of the difference including at least one of an erroneous user input, an equipment failure, a wellbore event, or a model error.

EXAMPLE #15

The non-transitory computer readable medium of Example #14 may feature program code that is executable by the processor to cause the processor to determine the source of the difference by determining a trigger causing the difference between the first trend and the second trend using a lookup table.

EXAMPLE #16

The non-transitory computer readable medium of Example #15 may feature program code that is executable by the processor to cause the processor to determine the trigger causing the difference between the first trend and the second trend using the lookup table by: determining, using the lookup table, a relationship between at least two of the first parameter, the second parameter, and a third parameter associated with the well environment or with the wellbore operation; and determining the trigger includes a violation of the relationship between the at least two of the first parameter, the second parameter, and the third parameter. The program code can also cause the processor to determine that the source of the difference is the erroneous user input, the equipment failure, the wellbore event, or the model error based on the trigger.

EXAMPLE #17

The non-transitory computer readable medium of any of Examples #14-16 may feature program code that is executable by the processor to cause the processor to determine that the source of the difference includes the erroneous user input in response to determining that an input parameter usable by the model to generate the multiple predicted values was provided by a user; or determine that the source of the difference includes the equipment failure in response to determining that the input parameter usable by the model to generate the multiple predicted values was provided by another sensor.

EXAMPLE #18

The non-transitory computer readable medium of any of Examples #14-17 may feature program code that is executable by the processor to cause the processor to determine that the source of the difference includes the wellbore event based on a change in data from another sensor positioned proximately to a wellbore.

EXAMPLE #19

The non-transitory computer readable medium of any of Examples #14-18 may feature program code that is executable by the processor to cause the processor to output the source of the difference between the first trend and the second trend; select a process for reducing the difference between the first trend and the second trend based on the source of the difference; and implement the process.

EXAMPLE #20

The non-transitory computer readable medium of any of Examples #14-19 may feature the wellbore event including a change in an environmental condition in a wellbore, a well tool operating in a specific manner, or the well tool failing to operate in a particular manner.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system for use in a wellbore, the system comprising:
a computing device including a processing device and a memory device, the memory device storing instructions which when executed by the processing device are configured for causing the processing device to:
generate, using a model, a plurality of predicted values of a first parameter associated with a well environment or with a wellbore operation;
determine a first trend indicated by the plurality of predicted values and occurring during a time period;
receive, from a sensor, a plurality of measured values of a second parameter associated with the well environment or with the wellbore operation;
determine a second trend indicated by the plurality of measured values and occurring during the time period;
determine a difference between the first trend and the second trend or a rate of change of the difference between the first trend and the second trend;
determine a trigger associated with the difference between the first trend and the second trend by:
determining a relationship between at least two parameters among (i) the first parameter, (ii) the second parameter, and (iii) a third parameter associated with the well environment or with the wellbore operation; and
determining that the trigger comprises a violation of the relationship; and
in response to the difference exceeding a first threshold or the rate of change exceeding a second threshold, determine, based on the trigger, that a source of the difference comprises at least one of an erroneous user input, an equipment failure, a wellbore event, or a model error.

2. The system of claim 1, wherein the instructions are further configured for causing the processing device to:
determine the relationship by using a lookup table.

3. The system of claim 1, wherein the instructions are further configured for causing the processing device to:
determine that the source of the difference comprises the erroneous user input in response to determining that an input parameter used by the model to generate the plurality of predicted values was provided by a user.

4. The system of claim 1, wherein the sensor is a first sensor, and wherein the instructions are further configured for causing the processing device to:
determine that the source of the difference comprises the wellbore event based on a change in data from a second sensor positioned proximately to the wellbore, the second sensor being different from the first sensor.

5. The system of claim 1, wherein the instructions are further configured for causing the processing device to:
select, based on the source of the difference, a process for reducing the difference between the first trend and the second trend; and
implement the process.

6. The system of claim 1, wherein the wellbore event comprises a change in an environmental condition in the wellbore, a well tool operating in a specific manner, or the well tool failing to operate in a particular manner.

7. A method comprising:
generating, by a processor and using a model, a plurality of predicted values of a first parameter associated with a well environment or with a wellbore operation;
determining, by the processor, a first trend indicated by the plurality of predicted values and occurring during a time period;
receiving, by the processor and from a sensor, a plurality of measured values of a second parameter associated with the well environment or with the wellbore operation;
determining, by the processor, a second trend indicated by the plurality of measured values and occurring during the time period;
determining, by the processor, a difference between the first trend and the second trend or a rate of change of the difference between the first trend and the second trend;
determining, by the processor, a trigger associated with the difference between the first trend and the second trend, wherein the trigger includes a violation of a relationship between at least two parameters among (i) the first parameter, (ii) the second parameter, and (iii) a third parameter associated with the well environment or with the wellbore operation; and
in response to the difference exceeding a first threshold or the rate of change exceeding a second threshold, determining, based on the trigger, a source of the difference comprising at least one of an erroneous user input, an equipment failure, a wellbore event, or a model error.

8. The method of claim 7, further comprising determining the relationship using a lookup table.

9. The method of claim 7, wherein the sensor is a first sensor, and further comprising:
determining that the source of the difference comprises the equipment failure in response to determining that an input parameter used by the model to generate the plurality of predicted values was provided by a second sensor that is different from the first sensor.

10. The method of claim 7, wherein the sensor is a first sensor, and further comprising determining that the source of the difference comprises the wellbore event based on a change in data from a second sensor positioned proximately to a wellbore, wherein the wellbore event comprises another change in an environmental condition in the wellbore, a well tool operating in a specific manner, or the well tool failing to operate in a particular manner.

11. The method of claim 7, further comprising:
selecting, based on the source of the difference, a process for reducing differences between the first trend and the second trend; and
implementing the process.

12. A non-transitory computer readable medium storing program code, which when executed by a processor is configured to cause the processor to:
generate, using a model, a plurality of predicted values of a first parameter associated with a well environment or with a wellbore operation;
determine a first trend indicated by the plurality of predicted values and occurring during a time period;
receive, from a sensor, a plurality of measured values of a second parameter associated with the well environment or with the wellbore operation;
determine a second trend indicated by the plurality of measured values and occurring during the time period;
determine a difference between the first trend and the second trend or a rate of change of the difference between the first trend and the second trend;
determine a trigger associated with the difference between the first trend and the second trend, wherein the trigger includes a violation of a relationship between at least two parameters among (i) the first parameter, (ii) the second parameter, and (iii) a third parameter associated with the well environment or with the wellbore operation; and
in response to the difference exceeding a first threshold or the rate of change exceeding a second threshold, determine, based on the trigger, a source of the difference comprising at least one of an erroneous user input, an equipment failure, a wellbore event, or a model error.

13. The non-transitory computer readable medium of claim 12, wherein the program code is executable by the processor to cause the processor to:
determine the relationship using a lookup table.

14. The non-transitory computer readable medium of claim 12, wherein the program code is executable by the processor to cause the processor to:
determine that the source of the difference comprises the erroneous user input in response to determining that an input parameter usable by the model to generate the plurality of predicted values was provided by a user; or
determine that the source of the difference comprises the equipment failure in response to determining that the input parameter usable by the model to generate the plurality of predicted values was provided by another sensor.

15. The non-transitory computer readable medium of claim 12, wherein the sensor is a first sensor, and wherein the program code is executable by the processor to cause the processor to:
determine that the source of the difference comprises the wellbore event based on a change in data from a second sensor positioned proximately to a wellbore, the second sensor being different from the first sensor.

16. The non-transitory computer readable medium of claim 12, wherein the program code is executable by the processor to cause the processor to:
select, based on the source of the difference, a process for reducing differences between the first trend and the second trend; and
implement the process.

17. The non-transitory computer readable medium of claim 12, wherein the wellbore event comprises a change in an environmental condition in a wellbore, a well tool operating in a specific manner, or the well tool failing to operate in a particular manner.

18. The system of claim 1, wherein the instructions are further configured to output the source of the difference between the first trend and the second trend on a display.

19. The method of claim 7, further comprising outputting the source of the difference between the first trend and the second trend on a display.

20. The non-transitory computer readable medium of claim 12, wherein the program code is executable by the processor to cause the processor to output the source of the difference between the first trend and the second trend on a display.

\* \* \* \* \*